United States Patent
Koga

(10) Patent No.: US 12,177,584 B2
(45) Date of Patent: *Dec. 24, 2024

(54) SOLID-STATE IMAGING DEVICE, METHOD OF DRIVING THE SAME, AND ELECTRONIC APPARATUS

(71) Applicant: SONY SEMICONDUCTOR SOLUTIONS CORPORATION, Kanagawa (JP)

(72) Inventor: Fumihiko Koga, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/496,661

(22) Filed: Oct. 27, 2023

(65) Prior Publication Data

US 2024/0056695 A1 Feb. 15, 2024

Related U.S. Application Data

(63) Continuation of application No. 18/093,705, filed on Jan. 5, 2023, now Pat. No. 11,902,678, which is a (Continued)

(30) Foreign Application Priority Data

Mar. 14, 2014 (JP) ................................. 2014-051895

(51) Int. Cl.
*H04N 25/616* (2023.01)
*H01L 27/146* (2006.01)
(Continued)

(52) U.S. Cl.
CPC ..... *H04N 25/616* (2023.01); *H01L 27/14612* (2013.01); *H01L 27/14636* (2013.01);
(Continued)

(58) Field of Classification Search
CPC ...... H04N 25/616; H04N 23/10; H04N 25/65; H04N 25/67; H04N 25/68; H04N 25/70;
(Continued)

(56) References Cited

U.S. PATENT DOCUMENTS

| | | |
|---|---|---|
| 9,961,284 B2 | 5/2018 | Koga |
| 10,237,500 B2 | 3/2019 | Koga |

(Continued)

FOREIGN PATENT DOCUMENTS

| | | |
|---|---|---|
| CN | 101873137 | 10/2010 |
| CN | 102202190 | 9/2011 |

(Continued)

OTHER PUBLICATIONS

International Search Report and Written Opinion for International (PCT) Patent Application No. PCT/JP2015/055743, dated Apr. 14, 2015, 9 pages.

(Continued)

*Primary Examiner* — Timothy J Henn
(74) *Attorney, Agent, or Firm* — Sheridan Ross PC

(57) ABSTRACT

The present technology relates to a solid-state imaging device that can improve imaging quality by reducing variation in the voltage of a charge retention unit, a method of driving the solid-state imaging device, and an electronic apparatus. A first photoelectric conversion unit generates and accumulates signal charge by receiving light that has entered a pixel, and photoelectrically converting the light. A first charge retention unit retains the generated signal charge. A first output transistor outputs the signal charge in the first charge retention unit as a pixel signal, when the pixel is selected by the first select transistor. A first voltage control transistor controls the voltage of the output end of the first output transistor. The present technology can be applied to pixels in solid-state imaging devices, for example.

19 Claims, 36 Drawing Sheets

Related U.S. Application Data continuation of application No. 17/185,539, filed on Feb. 25, 2021, now Pat. No. 11,575,847, which is a continuation of application No. 16/575,829, filed on Sep. 19, 2019, now Pat. No. 10,965,893, which is a continuation of application No. 16/265,403, filed on Feb. 1, 2019, now Pat. No. 10,462,398, which is a continuation of application No. 15/943,077, filed on Apr. 2, 2018, now Pat. No. 10,237,500, which is a continuation of application No. 15/124,204, filed as application No. PCT/JP2015/055743 on Feb. 27, 2015, now Pat. No. 9,961,284.

(51) Int. Cl.

| | | |
|---|---|---|
| *H04N 23/10* | (2023.01) | |
| *H04N 25/13* | (2023.01) | |
| *H04N 25/65* | (2023.01) | |
| *H04N 25/67* | (2023.01) | |
| *H04N 25/68* | (2023.01) | |
| *H04N 25/70* | (2023.01) | |
| *H04N 25/76* | (2023.01) | |
| *H04N 25/772* | (2023.01) | |
| *H04N 25/778* | (2023.01) | |
| *H10K 39/32* | (2023.01) | |

(52) U.S. Cl.
CPC .... *H01L 27/1464* (2013.01); *H01L 27/14645* (2013.01); *H01L 27/14647* (2013.01); *H01L 27/14665* (2013.01); *H04N 23/10* (2023.01); *H04N 25/65* (2023.01); *H04N 25/67* (2023.01); *H04N 25/68* (2023.01); *H04N 25/70* (2023.01); *H04N 25/76* (2023.01); *H04N 25/772* (2023.01); *H04N 25/778* (2023.01); *H10K 39/32* (2023.02); *H01L 27/14621* (2013.01); *H01L 27/14627* (2013.01); *H04N 25/134* (2023.01)

(58) Field of Classification Search
CPC .... H04N 25/76; H04N 25/772; H04N 25/778; H04N 25/134; H04N 25/59; H04N 25/62; H01L 27/14612; H01L 27/14636; H01L 27/1464; H01L 27/14645; H01L 27/14647; H01L 27/14665; H01L 27/14621; H01L 27/14627; H10K 39/32
See application file for complete search history.

(56) References Cited

U.S. PATENT DOCUMENTS

| | | | |
|---|---|---|---|
| 10,462,398 B2 | 10/2019 | Koga | |
| 10,965,893 B2 | 3/2021 | Koga | |
| 11,575,847 B2 | 2/2023 | Koga | |
| 11,902,678 B2 * | 2/2024 | Koga | H01L 27/14636 |
| 2001/0030704 A1 | 10/2001 | Kimura | |
| 2002/0085105 A1 | 7/2002 | Sohn | |
| 2005/0116264 A1 | 6/2005 | Watanabe | |
| 2005/0161712 A1 | 7/2005 | Koyama et al. | |
| 2007/0218579 A1 | 9/2007 | Lee et al. | |
| 2008/0185619 A1 | 8/2008 | Merrill | |
| 2010/0182465 A1 | 7/2010 | Okita | |
| 2011/0025898 A1 | 2/2011 | Ni | |
| 2011/0216212 A1 | 9/2011 | Watanabe et al. | |
| 2011/0293257 A1 | 12/2011 | Ariga | |
| 2012/0074299 A1 | 3/2012 | Ni | |
| 2013/0001730 A1 | 1/2013 | Miyanami | |
| 2013/0248939 A1 | 9/2013 | Sakai et al. | |
| 2013/0284893 A1 | 10/2013 | Kyushima et al. | |
| 2014/0078368 A1 | 3/2014 | Komori et al. | |
| 2015/0029375 A1 | 1/2015 | Sugawa et al. | |
| 2023/0142577 A1 | 5/2023 | Koga | |

FOREIGN PATENT DOCUMENTS

| | | |
|---|---|---|
| JP | 2001-320630 | 11/2001 |
| JP | 2005-278041 | 10/2005 |
| JP | 2007-329161 | 12/2007 |
| JP | 2008-227092 | 9/2008 |
| JP | 2009-182349 | 8/2009 |
| JP | 2010-193437 | 9/2010 |
| JP | 2010-278086 | 12/2010 |
| JP | 2011-029337 | 2/2011 |
| JP | 2011-138927 | 7/2011 |
| JP | 2012-151771 | 8/2012 |
| JP | 2014-045385 | 3/2014 |
| KR | 10-2007-0046017 | 5/2007 |
| KR | 10-2008-0063490 | 7/2008 |
| KR | 10-2010-0105377 | 9/2010 |
| KR | 10-2011-0010058 | 1/2011 |
| TW | 200425729 | 11/2004 |
| TW | 200836333 | 9/2008 |
| TW | 201100766 | 1/2011 |
| TW | 201106481 | 2/2011 |
| TW | 201215122 | 4/2012 |
| TW | 201240122 | 10/2012 |
| TW | 201315220 | 4/2013 |
| TW | 201319530 | 5/2013 |

OTHER PUBLICATIONS

Official Action (no English translation available) for Japanese Patent Application No. 2014-051895 mailed Mar. 9, 2017, 11 pages.
Official Action (with English translation) for Chinese Patent Application No. 201580011967.2, dated Dec. 26, 2018, 13 pages.
Official Action (with English translation) for Chinese Patent Application No. 201580011967.2, dated Jul. 2, 2019, 15 pages.
Official Action (with English translation) for Korean Patent Application No. 10-2016-7019553, dated Sep. 24, 2020, 16 pages.
Official Action for U.S. Appl. No. 15/124,204, dated Aug. 10, 2017, 19 pages.
Notice of Allowance for U.S. Appl. No. 15/124,204, dated Dec. 14, 2017, 7 pages.
Official Action for U.S. Appl. No. 15/943,077, dated Jun. 1, 2018, 21 pages.
Notice of Allowance for U.S. Appl. No. 15/943,077, dated Nov. 1, 2018, 7 pages.
Notice of Allowance for U.S. Appl. No. 15/943,077, dated Feb. 6, 2019, 2 pages.
Official Action for U.S. Appl. No. 16/265,403, dated Mar. 7, 2019, 18 pages.
Notice of Allowance for U.S. Appl. No. 16/265,403, dated Jun. 12, 2019, 5 pages.
Notice of Allowance for U.S. Appl. No. 16/265,403, dated Sep. 30, 2019, 2 pages.
Official Action for U.S. Appl. No. 16/575,829, dated Jul. 9, 2020, 20 pages.
Notice of Allowance for U.S. Appl. No. 16/575,829, dated Nov. 25, 2020, 5 pages.
Notice of Allowance for U.S. Appl. No. 16/575,829, dated Jan. 6, 2021, 2 pages.
Official Action for U.S. Appl. No. 17/185,539, dated Jun. 8, 2022, 20 pages.
Notice of Allowance for U.S. Appl. No. 17/185,539, dated Oct. 5, 2022, 8 pages.
Official Action for U.S. Appl. No. 18/093,705, dated May 11, 2023, 16 pages.
Notice of Allowance for U.S. Appl. No. 18/093,705, dated Sep. 27, 2023, 7 pages.

* cited by examiner

SOLID-STATE IMAGING DEVICE, METHOD OF DRIVING THE SAME, AND ELECTRONIC APPARATUS

CROSS REFERENCE TO RELATED APPLICATIONS

This application is a continuation of U.S. patent application Ser. No. 18/093,705, filed Jan. 5, 2023, which is a continuation of U.S. patent application Ser. No. 17/185,539, filed Feb. 25, 2021, now U.S. Pat. No. 11,575,847, which is a continuation of U.S. patent application Ser. No. 16/575,829, filed Sep. 19, 2019, now U.S. Pat. No. 10,965,893, which is a continuation of U.S. patent application Ser. No. 16/265,403, filed Feb. 1, 2019, now U.S. Pat. No. 10,462,398, which is a continuation of U.S. patent application Ser. No. 15/943,077, filed Apr. 2, 2018, now U.S. Pat. No. 10,237,500, which is a continuation of U.S. patent application Ser. No. 15/124,204, filed Sep. 7, 2016, now U.S. Pat. No. 9,961,284, which is a national stage application under 35 U.S.C. 371 and claims the benefit of PCT Application No. PCT/JP2015/055743 having an international filing date of Feb. 27, 2015, which designated the United States, which PCT application claimed the benefit of Japanese Patent Application No. 2014-051895 filed Mar. 14, 2014, the disclosures of which are incorporated herein by reference in their entirety.

TECHNICAL FIELD

The present technology relates to a solid-state imaging device, a method of driving the solid-state imaging device, and an electronic apparatus, and more particularly, to a solid-state imaging device that can improve imaging quality by reducing variation in the voltage of a charge retention unit, a method of driving the solid-state imaging device, and an electronic apparatus.

BACKGROUND ART

A structure having a photoelectric conversion unit disposed outside a semiconductor substrate has been recently suggested as a technique for discontinuously changing the characteristics of an image sensor. For example, Patent Documents 1 through 3 each disclose a structure in which a photoelectric conversion unit is disposed in an upper portion of a semiconductor substrate, and photoelectrically converted signals are accumulated in the semiconductor substrate. In such a structure, photoelectric conversion characteristics that are conventionally determined by a semiconductor substrate material can be greatly changed. Such a structure might bring out a possibility that the sensor technology can be applied to the fields that are not easily realized with image sensors using conventional silicon (Si), such as use of far-infrared rays.

Also, in a pixel array in which red, blue, and green color filters that are widely used in today's image sensors are arranged in a two-dimensional manner, light of a certain wavelength is absorbed on a pixel-by-pixel basis, so that color separation is conducted. In a red pixel, for example, light of the wavelength of blue and green is absorbed by the color filter and is lost.

To counter this problem, Patent Document 1 suggests a stacked solid-state imaging device in which photoelectric conversion regions for photoelectrically converting red, blue, and green light are stacked in the same pixel space, for example. With this structure, decreases in sensitivity due to light absorption by color filters can be reduced. Furthermore, this structure does not need any interpolating, and therefore, an effect to avoid generation of false colors can be expected.

In a structure having a photoelectric conversion unit disposed outside a semiconductor substrate, a contact portion that electrically connects the photoelectric conversion unit and the semiconductor substrate is necessary. On the semiconductor substrate side, the contact portion is connected to an n-type diffusion layer surrounded by a p-type semiconductor, for example. This n-type diffusion layer functions as a charge retention unit that retains photoelectrically converted charge, but a buried PN junction cannot be formed due to the contact portion. As a result, leakage current is generated. For example, in a case where an n-type diffusion layer surrounded by a p-type semiconductor is used, a reverse bias leakage current of a PN junction is generated.

CITATION LIST

Patent Documents

Patent Document 1: Japanese Patent Application Laid-Open No. 2007-329161
Patent Document 2: Japanese Patent Application Laid-Open No. 2010-278086
Patent Document 3: Japanese Patent Application Laid-Open No. 2011-138927 (FIG. 15)

SUMMARY OF THE INVENTION

Problems to be Solved by the Invention

Lowering the voltage of the charge retention unit is effective in reducing leakage current generation. However, even if the voltage of the charge retention unit is lowered, variation in the voltage of the charge retention unit among the pixels leads to variation in the amount of leakage current, resulting in point defects in the image.

Also, in a structure in which the charge retention unit is connected directly to the photoelectric conversion unit, for example, the voltage to be applied to the photoelectric conversion unit varies due to variation in the voltage of the charge retention unit, and photoelectric conversion efficiency also varies accordingly. As a result, the imaging quality of the image sensor deteriorates.

The present technology has been made in view of such circumstances, and aims to improve imaging quality by reducing variation in the voltage of a charge retention unit.

Solutions to Problems

A solid-state imaging device as a first aspect of the present technology includes a pixel that includes: a first photoelectric conversion unit that generates and accumulates signal charge by receiving light having entered the pixel and photoelectrically converting the light; a first charge retention unit that retains the signal charge generated by the first photoelectric conversion unit; a first select transistor that controls selecting of the pixel; a first output transistor that outputs the signal charge in the first charge retention unit as a pixel signal when the pixel is selected by the first select transistor; and a first voltage control transistor that controls the voltage of the output end of the first output transistor.

A method as a second aspect of the present technology is a method of driving a solid-state imaging device including a pixel that includes a first photoelectric conversion unit, a first charge retention unit, a first select transistor, a first output transistor, and a first voltage control transistor, the method including: the first photoelectric conversion unit generating and accumulating signal charge by receiving light having entered the pixel and photoelectrically converting the light; the first charge retention unit retaining the signal charge generated by the first photoelectric conversion unit; the first select transistor controlling selecting of the pixel; the first output transistor outputting the signal charge in the first charge retention unit as a pixel signal when the pixel is selected by the first select transistor; and the first voltage control transistor controlling the voltage of the output end of the first output transistor.

An electronic apparatus as a third aspect of the present technology includes a solid-state imaging device including a pixel, the pixel including: a first photoelectric conversion unit that generates and accumulates signal charge by receiving light having entered the pixel and photoelectrically converting the light; a first charge retention unit that retains the signal charge generated by the first photoelectric conversion unit; a first select transistor that controls selecting of the pixel; a first output transistor that outputs the signal charge in the first charge retention unit as a pixel signal when the pixel is selected by the first select transistor; and a first voltage control transistor that controls the voltage of the output end of the first output transistor.

In the first through third aspects of the present technology, the first photoelectric conversion unit generates and accumulates signal charge by receiving light having entered a pixel and photoelectrically converting the light, the first charge retention unit retains the signal charge generated by the first photoelectric conversion unit, the first select transistor controls selecting of the pixel, the first output transistor outputs the signal charge in the first charge retention unit as a pixel signal when the pixel is selected by the first select transistor, and the first voltage control transistor controls the voltage of the output end of the first output transistor.

The solid-state imaging device and the electronic apparatus may be independent devices, or may be modules to be incorporated into other devices.

Effects of the Invention

According to the first through third aspects of the present technology, imaging quality can be increased by reducing variation in the voltage of a charge retention unit.

Note that, the effects of the present technology are not limited to the effects described herein, and may include any of the effects described in the present disclosure.

MODES FOR CARRYING OUT THE INVENTION

The following is a description of modes (hereinafter referred to as embodiments) for carrying out the present technology. Note that, explanation will be made in the following order.

1. Description of a basic pixel
2. First embodiment (an example structure of a pixel that uses electrons as signal charge in a photoelectric conversion film)
3. Second embodiment (an example structure of a pixel that uses holes as signal charge in a photoelectric conversion film)
4. Third embodiment (an example structure of a pixel that includes a transfer transistor in a photodiode)
5. Fourth embodiment (an example structure of a pixel that includes a photoelectric conversion film and a photodiode)
6. Fifth embodiment (an example structure of a pixel that includes a photoelectric conversion film and a photodiode)

1. Description of a Basic Pixel

To facilitate understanding of the present technology, a pixel of a solid-state imaging device as a basic structure to which the present technology is applied (such a pixel will be hereinafter referred to as a basic pixel) is first described.

<Equivalent Circuit of a Basic Pixel>

Figure 1:
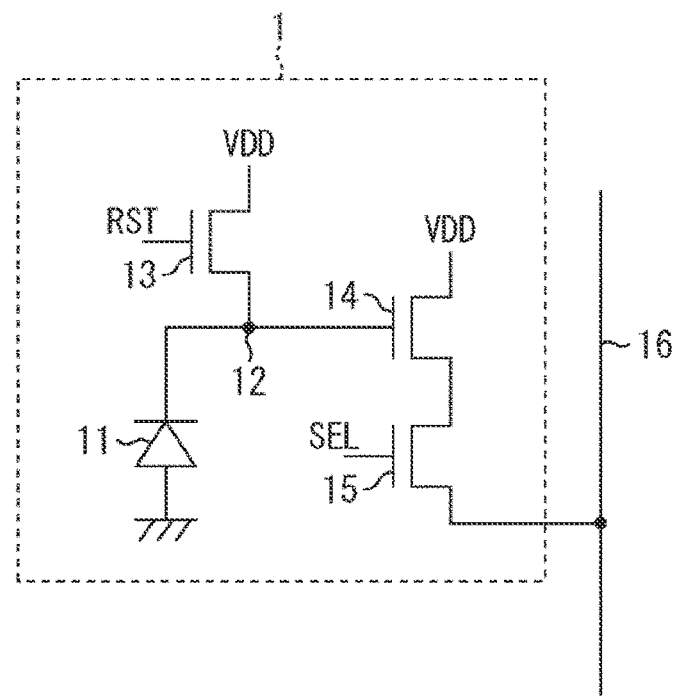
FIG. 1 is a diagram showing an equivalent circuit of a basic pixel.

FIG. 1 shows an equivalent circuit of a basic pixel.

The pixel 1 shown in FIG. 1 includes a photoelectric conversion unit 11, a charge retention unit 12, a reset transistor 13, an amplifier transistor (an output transistor) 14, and a select transistor 15.

The photoelectric conversion unit 11 generates and accumulates charge (signal charge) in accordance with the amount of received light. While one end of the photoelectric conversion unit 11 is grounded, the other end is connected to the charge retention unit 12, the source of the reset transistor 13, and the gate of the amplifier transistor 14. In the structure shown in FIG. 1, the signal charge is electrons.

The charge retention unit 12 retains charge read out from the photoelectric conversion unit 11. As will be described later with reference to FIG. 2, the charge retention unit 12 is connected to one end of the photoelectric conversion unit 11, the source of the reset transistor 13, and the gate of the amplifier transistor 14, and therefore, the charge is retained by all of these components in practice.

When switched on by a reset signal RST supplied to its gate, the reset transistor 13 resets the potential of the charge retention unit 12, as the charge accumulated in the charge retention unit 12 is discharged to the drain (a power supply voltage VDD).

The gate of the amplifier transistor 14 is connected to the charge retention unit 12, the drain is connected to the power supply voltage VDD, and the source is connected to the drain of the select transistor 15. The amplifier transistor 14 outputs a pixel signal in accordance with the potential of the charge retention unit 12. That is, the amplifier transistor 14 forms a source follower circuit with a load MOS (not shown) serving as a constant current source connected thereto via a column signal line 16 that transmits a pixel signal output from the pixel 1, and the pixel signal at the level corresponding to the charge accumulated in the charge retention unit 12 is output to an AD converter (not shown) from the amplifier transistor 14 via the select transistor 15. The load MOS is provided in the AD converter provided for each column corresponding to more than one of the pixels 1 that are two-dimensionally arranged, for example.

The drain of the select transistor 15 is connected to the source of the amplifier transistor 14, and the source is connected to the column signal line 16 that transmits pixels signals of the respective pixels 1 arranged in a column direction (a vertical direction). The select transistor 15 is switched on when the pixel 1 is selected by a select signal SEL supplied to its gate, and the select transistor 15 outputs the pixel signal of the pixel 1 to the AD converter via the column signal line 16.

<Cross-Section Structure of a Basic Pixel>

Figure 2:
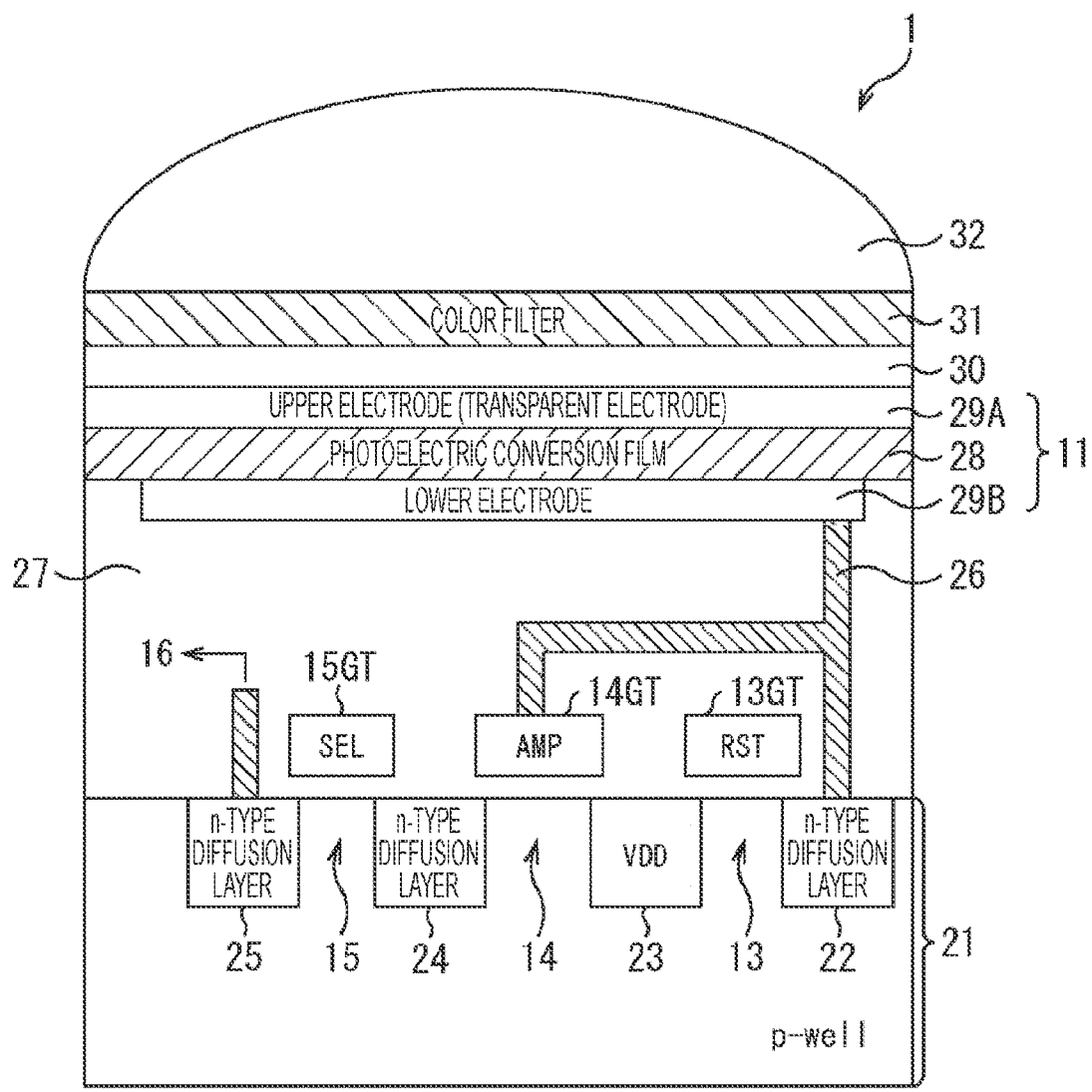
FIG. 2 is a diagram showing a cross-section structure of the basic pixel.

FIG. 2 is a diagram showing a cross-section structure of the pixel 1.

In the pixel 1, the reset transistor 13, the amplifier transistor 14, and the select transistor 15 are formed in an interface (the upper surface in the drawing) of a p-type semiconductor substrate (p-well) 21.

Specifically, the reset transistor 13 is formed with a gate portion 13GT above the p-type semiconductor substrate 21, and n-type diffusion layers 22 and 23 in the p-type semiconductor substrate 21. The amplifier transistor 14 is formed with a gate portion 14GT above the p-type semiconductor substrate 21, and n-type diffusion layers 23 and 24 in the p-type semiconductor substrate 21. The select transistor 15 is formed with a gate portion 15GT above the p-type semiconductor substrate 21, and n-type diffusion layers 24 and 25 in the p-type semiconductor substrate 21. The gate portions 13GT, 14GT, and 15GT are formed with polysilicon, for example.

The n-type diffusion layer 22 serves as the source of the reset transistor 13 and the charge retention unit 12, and is connected to a lower electrode 29B (described later) of the photoelectric conversion unit 11 and the gate portion 14GT of the amplifier transistor 14 by a metal line 26. Consequently, the lower electrode 29B of the photoelectric conversion unit 11, the n-type diffusion layer 22, and the gate portion 14GT of the amplifier transistor 14, which are connected by the metal line 26, form the charge retention unit 12 in which charge is retained. The metal line 26 is formed with a material, such as tungsten (W), aluminum (Al), or copper (Cu).

The n-type diffusion layer 23 serves as the drain of the reset transistor 13 and the drain of the amplifier transistor 14. The power supply voltage VDD is applied to the n-type diffusion layer 23.

The n-type diffusion layer 24 serves as the source of the amplifier transistor 14 and the drain of the select transistor 15. The n-type diffusion layer 25 functions as the source of the select transistor 15, and is connected to the column signal line 16.

The photoelectric conversion unit 11 is formed on the upper side of the respective pixel transistors (the reset transistor 13, the amplifier transistor 14, and the select transistor 15) of the p-type semiconductor substrate 21, with an insulating layer 27 being interposed in between.

The photoelectric conversion unit 11 is formed with a structure in which a photoelectric conversion film 28 is interposed between an upper electrode 29A and the lower electrode 29B. The photoelectric conversion film 28 may be formed with an organic photoelectric conversion film, a CIGS (a compound of Cu, In, Ga, and Se), a CIS (a compound of Cu, In, and Se), a chalcopyrite structure semiconductor, or a compound semiconductor such as GaAs, for example. The upper electrode 29A is formed with a transparent electrode film, such as an indium tin oxide (ITO) film or an indium zinc oxide film. The lower electrode 29B is formed with an electrode film made or tungsten (W), aluminum (Al), or copper (Cu), for example. While the upper electrode 29A is formed on the surfaces of all the pixels, the lower electrode 29B is formed for each pixel. The upper electrode 29A is connected to GND (ground).

A color filter 31 and an on-chip lens 32 are formed on the upper side of the upper electrode 29A, with a protection film (insulating film) 30 being interposed in between. Color filters 31 are arranged in the Bayer pattern, with one pixel unit being formed with a red pixel, a green pixel, and a blue pixel. Consequently, the photoelectric conversion film 28 photoelectrically converts light of red, green or blue that has passed through the color filter 31.

The pixel 1 is formed with the above described cross-section structure.

Example (1) of Driving of a Basic Pixel

Figure 3:
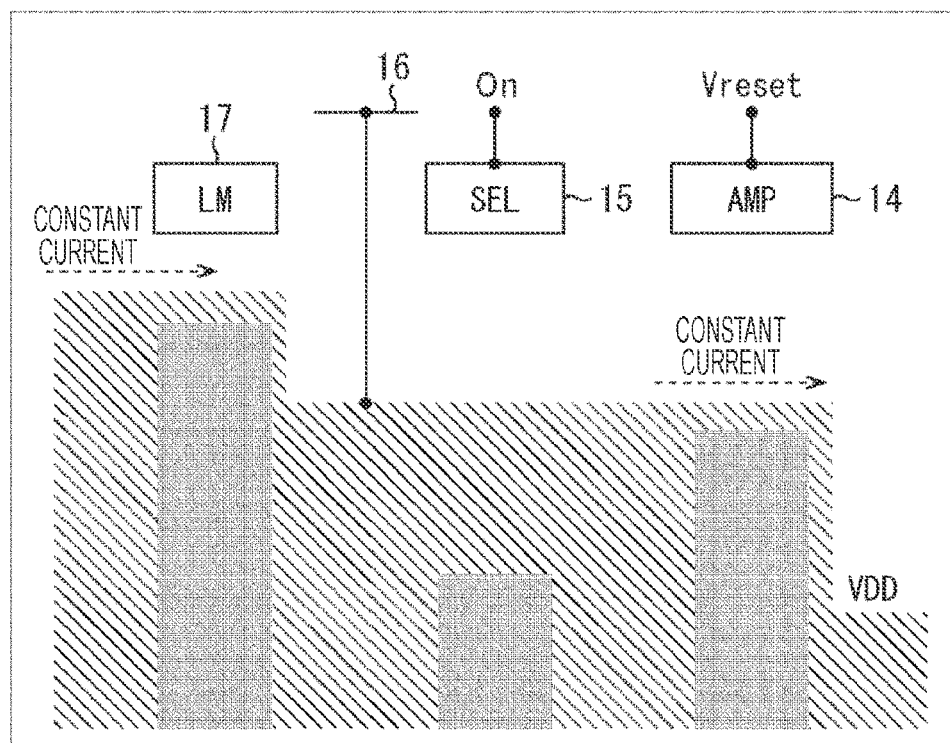
FIG. 3 is a diagram for explaining an example (1) of driving of the basic pixel.
Figure 4:
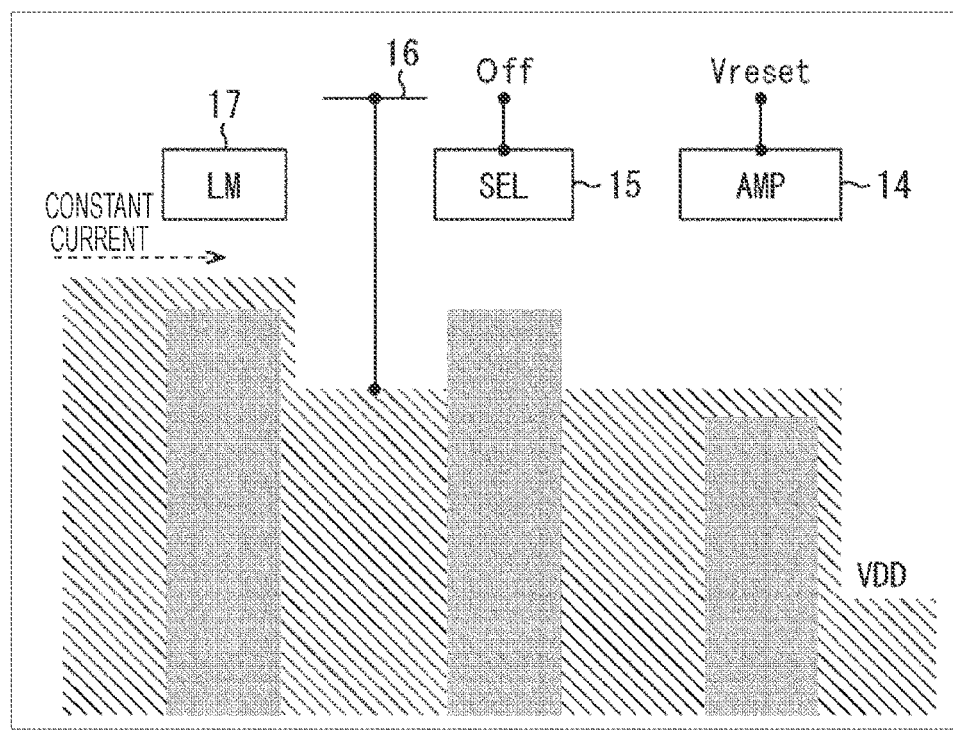
FIG. 4 is a diagram for explaining the example (1) of driving of the basic pixel.
Figure 5:
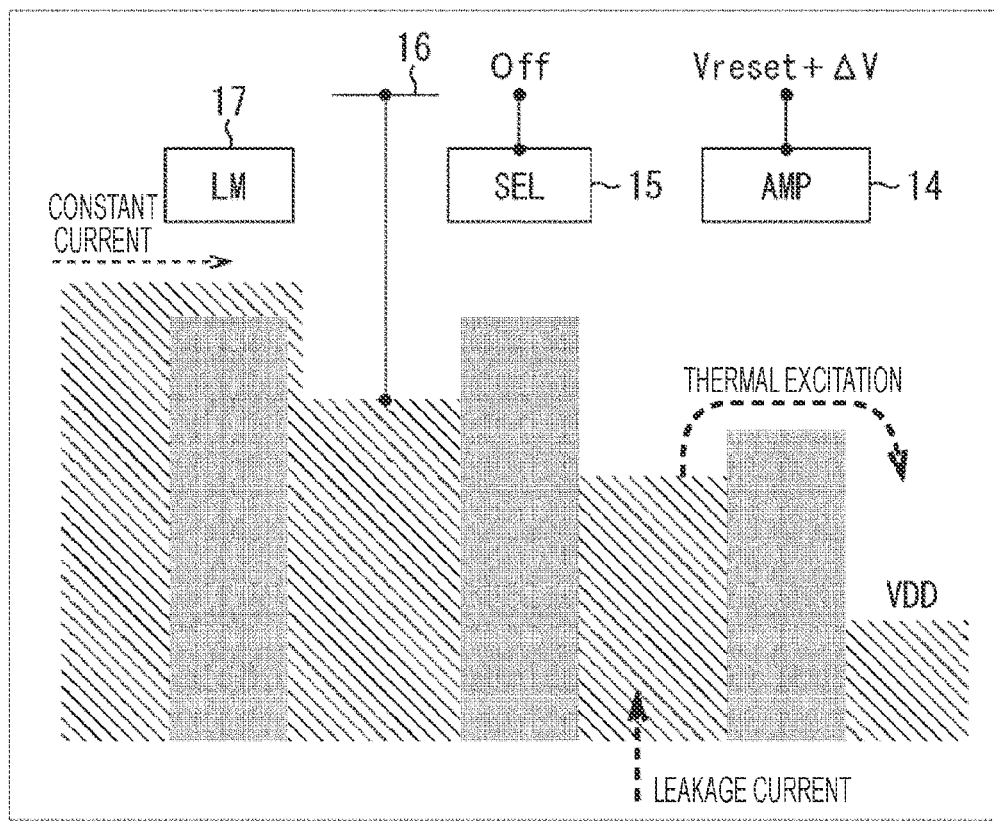
FIG. 5 is a diagram for explaining the example (1) of driving of the basic pixel.

Referring now to FIGS. 3 through 5, driving of the pixel 1 is described.

FIGS. 3 through 5 are diagrams each showing operation of the three transistors of the amplifier transistor 14, the select transistor 15, and a load MOS 17 forming the source follower circuit with the amplifier transistor 14 in the pixel 1. In FIGS. 3 through 5, the flow of current (electrons) is shown as a water flow, and the gates of the transistors are shown as floodgates. In FIGS. 3 through 5, switching on and off of the gates of the transistors are indicated by the heights of the floodgates in gray. As the heights of the gray floodgates change, the water flow (current) indicated by hatched lines (shaded portions) is controlled. In the drawings, the heights in the vertical direction indicate voltage. The higher the voltage, the smaller the height of a gray floodgate or the height of a shaded portion.

As shown in FIG. 3, after the select transistor 15 is switched on, the reset transistor 13 (not shown) is switched on, and the voltage of the charge retention unit 12 is reset to the initial state. As a result, the gate portion 14GT of the amplifier transistor 14, which is part of the charge retention unit 12, is set at a reset voltage (Vreset).

As shown in FIG. 4, when the select transistor 15 is switched off, the amplifier transistor 14 is detached from the column signal line 16, and the source of the amplifier transistor 14 enters a floating state. As a result, electrons move from under the gate and the source of the amplifier transistor 14 toward the drain, and the voltage rises, as shown in FIG. 5. The amount pV of this increase in voltage is determined by the balance between the leakage current generated at the source of the amplifier transistor 14 and the amount of current flowing from the source to the drain due to thermal excitation. However, the leakage current and the amount of current depend on the defect density in the n-type diffusion layer 24 and the threshold value of the amplifier transistor 14, and therefore, the amount EV of the increase in voltage varies among the pixels.

The potential under the gate of the amplifier transistor 14 is firmly capacitive-coupled to the charge retention unit 12 via a gate insulating film (gate oxide film). As a result, after the select transistor 15 is switched off, the voltage of the charge retention unit 12 rises, and the amount of this increase in voltage varies among the pixels. Signal charge is then accumulated while the amount of the increase in voltage vary among the pixels.

As the voltage of the charge retention unit 12 rises, the leakage current of the solid-state imaging device increases. Also, the variation in the voltage of the charge retention unit 12 leads to variation in the amount of leakage current. As a result, point defects are generated in the image.

Furthermore, since the charge retention unit 12 is connected to the lower electrode 29B of the photoelectric conversion film 28 as described above with reference to FIG. 2, the voltage to be applied to the photoelectric conversion film 28 also varies among the pixels. As a result, the sensitivity of the photoelectric conversion film 28 and the leakage current of the photoelectric conversion film 28 vary, and the imaging quality of the solid-state imaging device deteriorates.

As described above, in a structure in which the charge retention unit 12 is connected directly to (the lower electrode 29B of) the photoelectric conversion unit 11 as in the pixel 1, the voltage to be applied to the photoelectric conversion unit 11 varies due to variation in the voltage of the charge retention unit 12, and therefore, photoelectric conversion efficiency varies.

As a result, the imaging quality of the solid-state imaging device deteriorates.

Note that, the above described driving of the pixel 1 is the drive control to be performed to reset the pixel 1 while the select transistor 15 is in an on-state.

However, in the pixel 1, driving can be performed to reset the pixel 1 while the select transistor 15 is in an off-state, and switch on the select transistor 15 later.

Example (2) of Driving of a Basic Pixel

Figure 6:
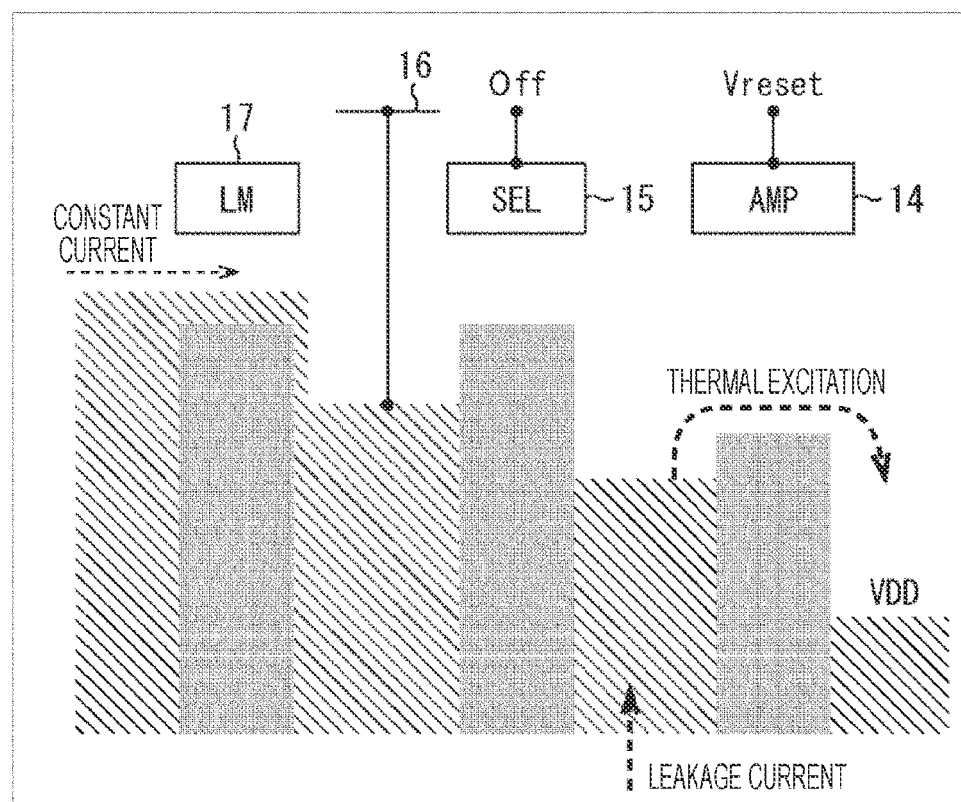
FIG. 6 is a diagram for explaining an example (2) of driving of the basic pixel.
Figure 7:
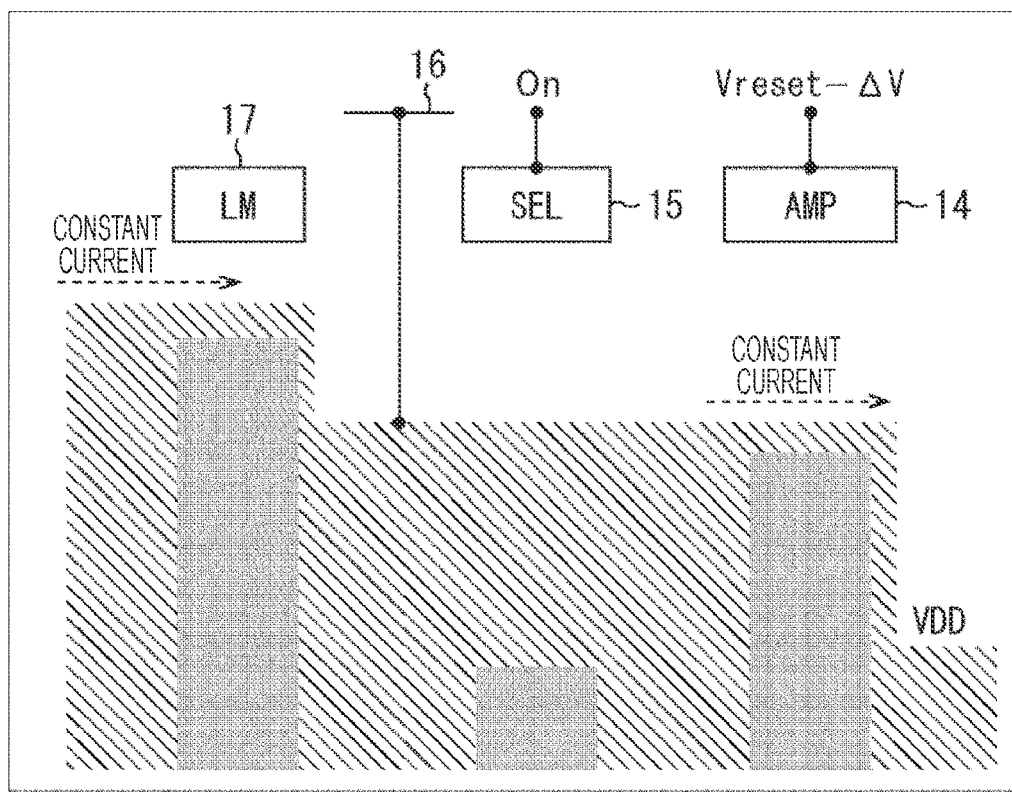
FIG. 7 is a diagram for explaining the example (2) of driving of the basic pixel.
Figure 8:
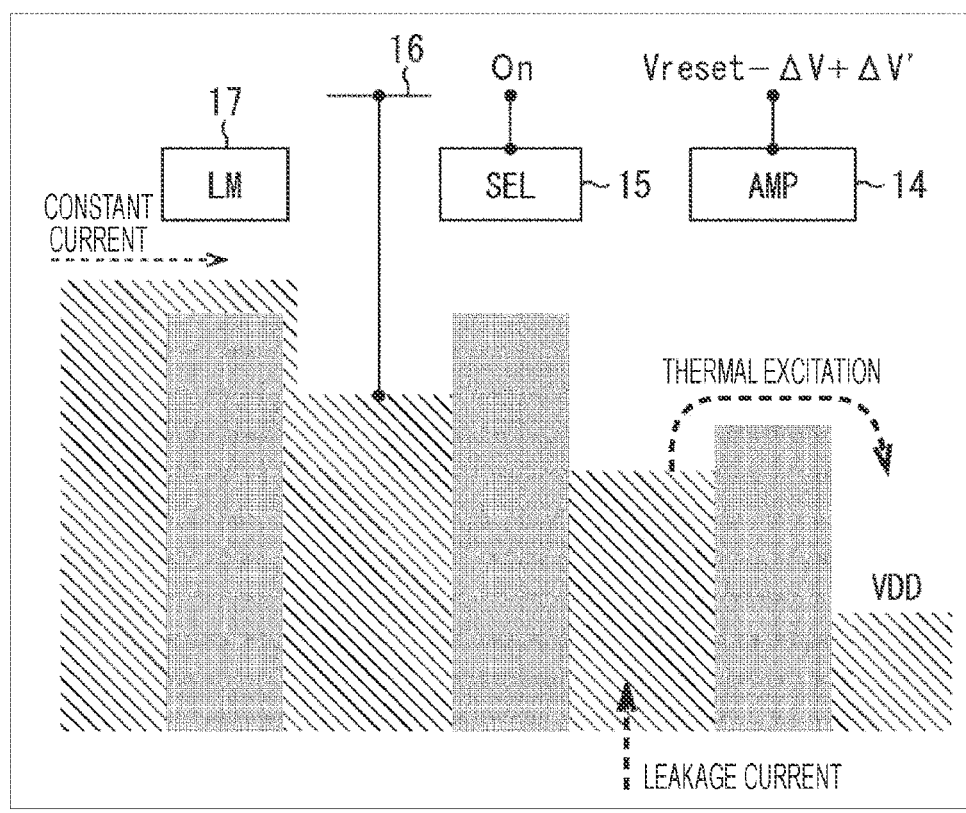
FIG. 8 is a diagram for explaining the example (2) of driving of the basic pixel.

Referring to FIGS. 6 through 8, driving to be performed to reset the pixel 1 while the select transistor 15 is in an off-state, and switch on the select transistor 15 later is described.

FIG. 6 shows a situation where the select transistor 15 is in an off-state, the reset voltage (Vreset) is supplied to the amplifier transistor 14, and the pixel 1 is reset. In this situation, the pixel 1 is reset while the voltage under the gate and of the source of the amplifier transistor 14 has risen.

Next, as shown in FIG. 7, the select transistor 15 is switched on, and the reset signal RST indicating the state at a time of resetting is output to the column signal line 16. The potential under the gate and of the source of the amplifier transistor 14 then becomes lower. As a result, the gate voltage of the amplifier transistor 14 becomes lower due to capacitive coupling via the gate insulating film. The amount of the decrease in voltage depends on the variation in the voltage under the gate and of the source of the amplifier transistor 14. However, the voltage under the gate and of the source of the amplifier transistor 14 and the voltage of the source in the situation shown in FIG. 6 vary among the pixels, and therefore, the gate potential of the amplifier transistor 14 in the situation shown in FIG. 7 also varies among the pixels. As a result, the variation in the reset potential of the pixel 1 becomes larger.

As the reset voltage of the pixel 1 varies, the operation margin of the amplifier transistor 14 becomes narrower. For example, in a case where the amplifier transistor 14 is made to operate as a source follower, it is necessary to secure an appropriate difference between the potential under the gate and of the drain of the amplifier transistor 14. If the gate potential of the amplifier transistor 14 varies, the difference in potential becomes smaller, and some of the pixels have source followers with low gains. As a result, high-gain pixels and low-gain pixels coexist, and the imaging quality of the solid-state imaging device deteriorates. This problem occurs not only in a case where the gate of the amplifier transistor 14 is used as the charge retention unit 12, but also in a case where the gate is not used as the charge retention unit 12, such as a case where a transfer transistor is interposed between the photoelectric conversion unit 11 and the amplifier transistor 14.

Next, as shown in FIG. 8, when the select transistor 15 is switched off, and signal accumulation is started, the gate of the amplifier transistor 14 is again boosted to the reset voltage (Vreset). However, a certain time is necessary before the thermally excited current matches the leakage current. During this period, the influence of the above described variation in reset potential among the pixels remains. In a case where the gate of the amplifier transistor 14 is used as the charge retention unit 12, leakage current varies as a result, and point defects appear in the image. Further, in a case where the charge retention unit 12 is connected directly to (the lower electrode 29B of) the photoelectric conversion unit 11, the sensitivity of the photoelectric conversion film 28 and the leakage current of the photoelectric conversion film 28 vary, and the imaging quality of the solid-state imaging device deteriorates.

As described above, in the driving operation in which the pixel 1 is reset while the select transistor 15 is in an off-state, and the select transistor 15 is later switched on, the voltage to be applied to the photoelectric conversion unit 11 varies due to variation in the voltage of the charge retention unit 12. As a result, the imaging quality of the solid-state imaging device deteriorates.

In view of the above, the description below concerns pixel structures in which variation in the voltage of the charge retention unit 12 is made smaller than that in a basic pixel so as to reduce imaging quality degradation.

Note that, in the respective embodiments described below, the components equivalent to those of the above described basic pixel are denoted by the same reference numerals as those used in the basic pixel, and explanation of them will not be unnecessarily repeated.

First Embodiment

Referring now to FIGS. 9 through 15, a first embodiment of a pixel to which the present technology is applied is described.

Figure 9:
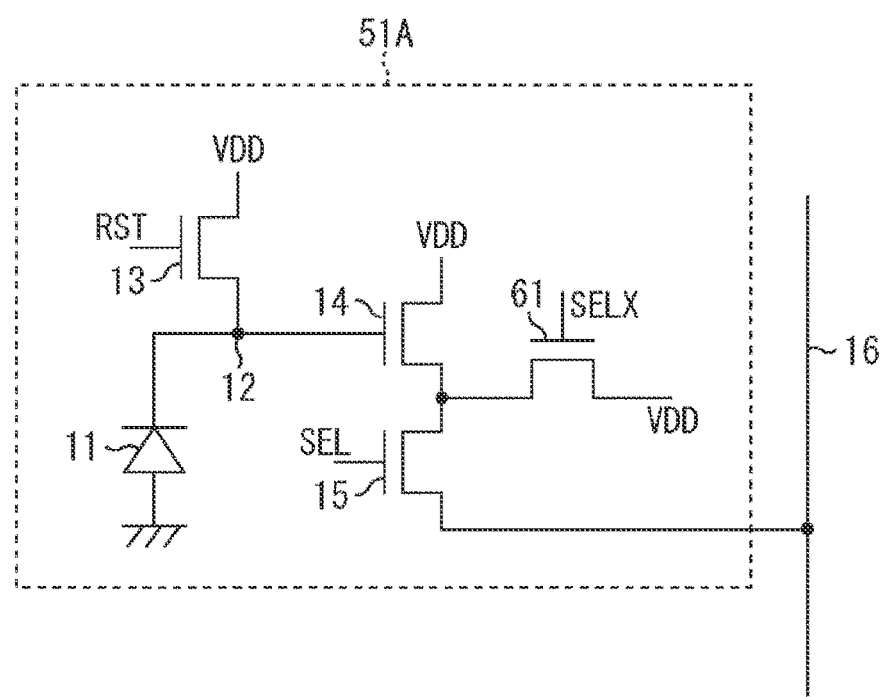
FIG. 9 is a diagram showing an equivalent circuit of a pixel according to a first embodiment.

FIG. 9 shows an equivalent circuit of a pixel 51A according to the first embodiment.

The pixel 51A shown in FIG. 9 includes a photoelectric conversion unit 11, a charge retention unit 12, a reset transistor 13, an amplifier transistor 14, a select transistor 15, and a voltage control transistor 61.

That is, the pixel 51A differs from the structure of the basic pixel of FIG. 1 in further including the voltage control transistor 61. The drain of the voltage control transistor 61 is connected to the power supply voltage VDD, and the source is connected to the source of the amplifier transistor 14 and the drain of the select transistor 15.

When switched on by a voltage control signal SELX supplied to its gate, the voltage control transistor 61 sets (fixes) the voltage of the source (the output end) of the amplifier transistor 14 at the power supply voltage VDD.

Figure 10:
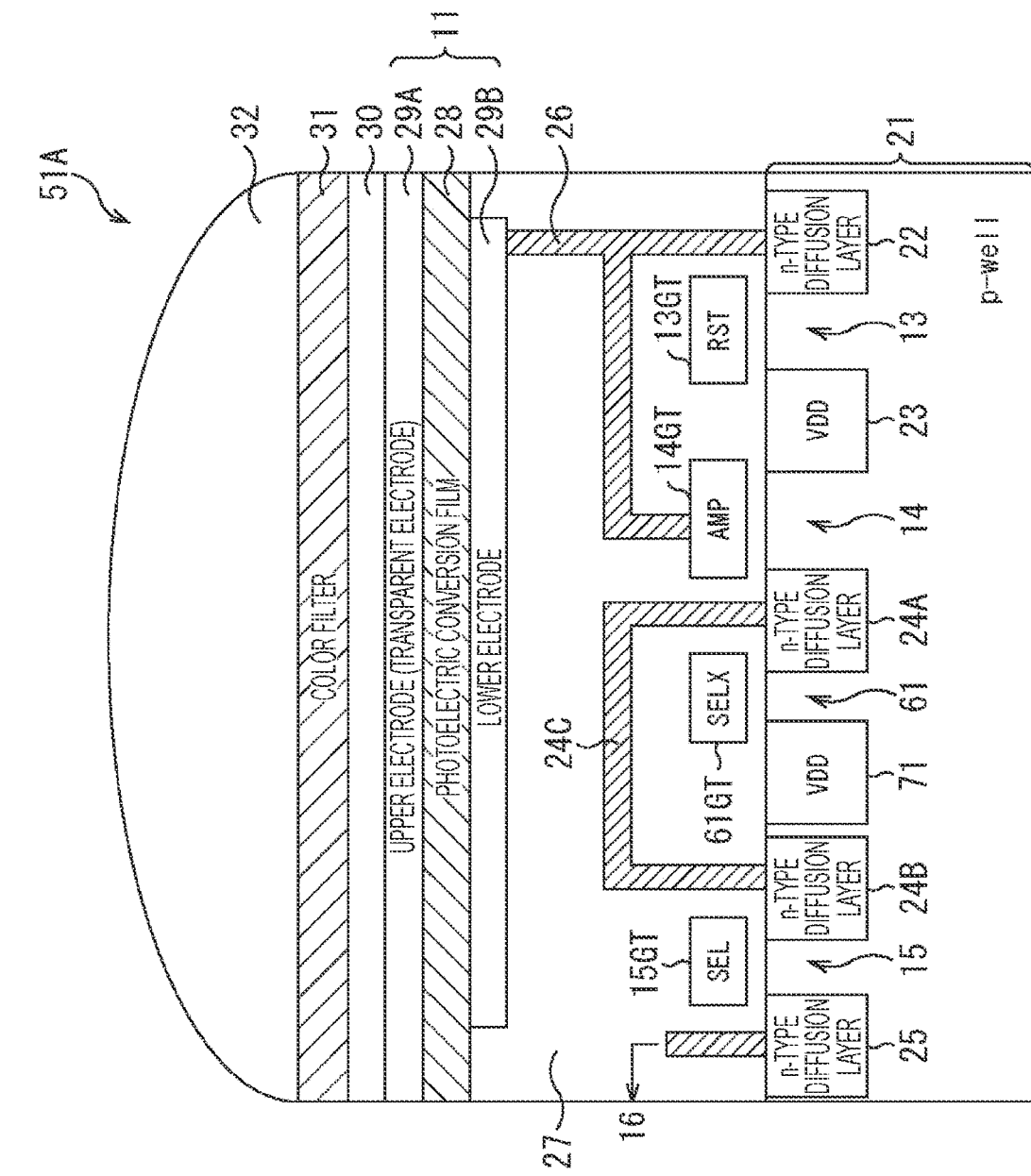
FIG. 10 is a diagram showing a cross-section structure of the pixel according to the first embodiment.

FIG. 10 is a diagram showing a cross-section structure of the pixel 51A.

As the voltage control transistor 61 is additionally provided in the cross-section structure of the pixel 51A shown in FIG. 10, a gate portion 61GT of the voltage control transistor 61 and an n-type diffusion layer 71 are also additionally provided. The power supply voltage VDD is applied to the n-type diffusion layer 71 serving as the drain of the voltage control transistor 61.

The n-type diffusion layer 24 that functions as the source of the amplifier transistor 14 and the drain of the select transistor 15 in FIG. 2 also serves as the source of the voltage control transistor 61 in the first embodiment. Therefore, the n-type diffusion layer 24 is replaced with two n-type diffusion layers 24A and 24B, and a metal line 24C connecting the two n-type diffusion layers 24A and 24B in FIG. 10. However, this structure has been developed because it is difficult to draw a structure that serves as the sources/drains of the three transistors (the amplifier transistor 14, the select transistor 15, and the voltage control transistor 61) in a drawing, and this structure does not necessarily include the two n-type diffusion layers 24A and 24B. Therefore, in practice, the sources/drains of the three transistors can be formed with a single n-type diffusion layer 24 as in FIG. 2.

<First Driving>

Referring now to FIGS. 11 through 15, driving (first driving) of the pixel 51A according to the first embodiment is described.

After first detecting a signal level (a reset signal level) prior to signal accumulation, the pixel 51A accumulates signal charge. The pixel 51A then reads the accumulated signal charge, and performs a CDS (Correlated Double Sampling) process, to determine a difference between the reset signal level prior to the accumulation and the signal level (the accumulated signal level) after the accumulation. Through the CDS process, fixed pattern noise unique to the pixel, such as kTC noise and variation in the threshold value of the amplifier transistor 14, can be removed.

Figure 11:
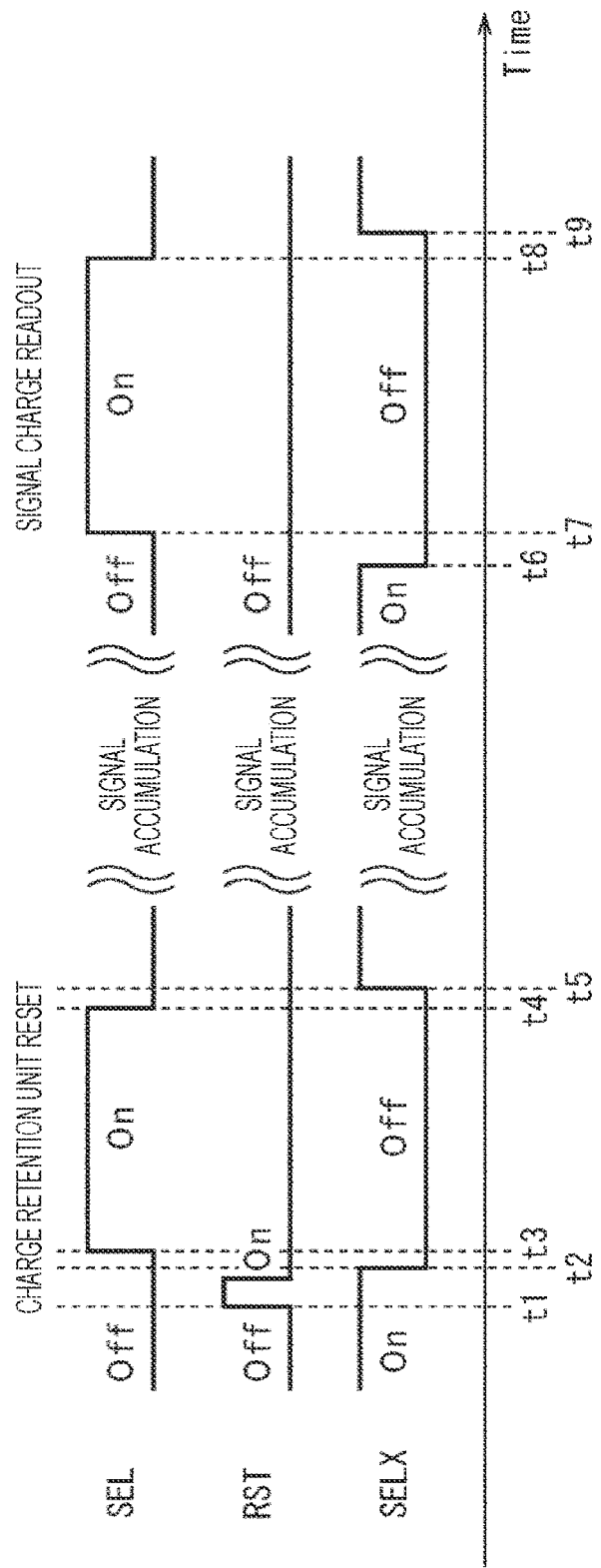
FIG. 11 is a diagram for explaining driving of the pixel according to the first embodiment.

FIG. 11 shows a timing chart of the signals to be supplied to the respective gates of the select transistor 15, the reset transistor 13, and the voltage control transistor 61 in accordance with the CDS process to be performed by the pixel 51A.

Figure 12:
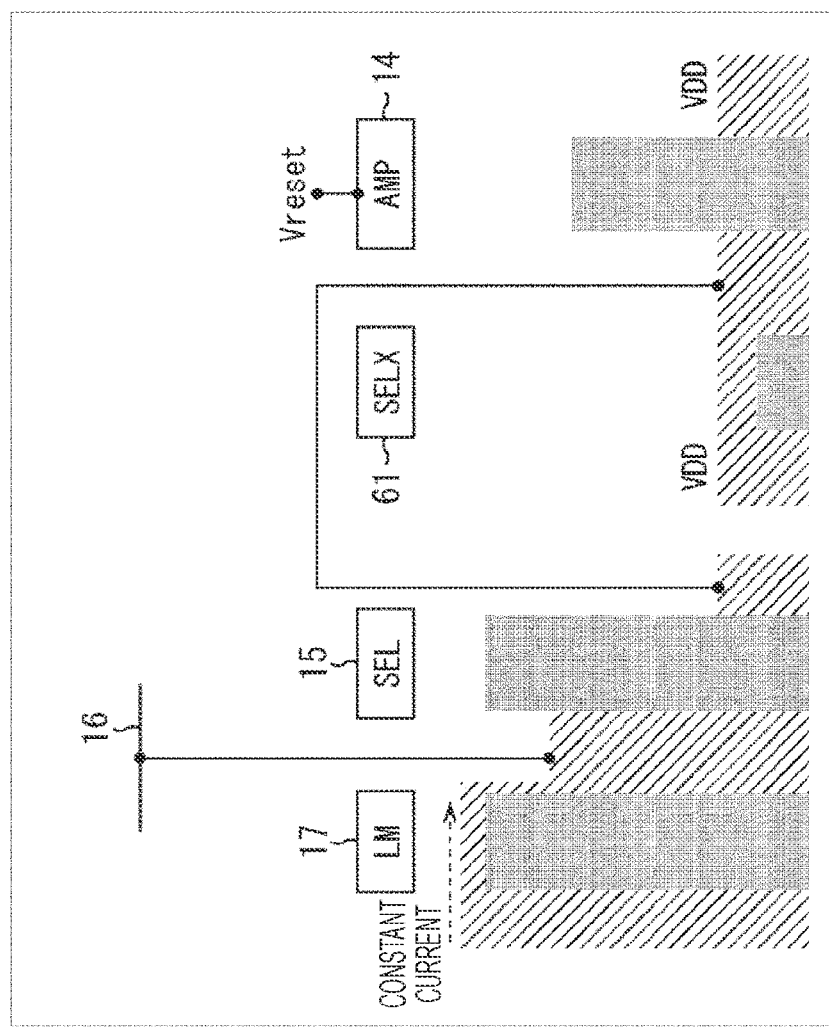
FIG. 12 is a diagram for explaining driving of the pixel according to the first embodiment.

First, at time t1 when the select transistor 15 is in an off-state and the voltage control transistor 61 is in an on-state, the reset signal RST becomes high, and the reset transistor 13 is switched on, so that the voltage of the charge retention unit 12 is reset to the initial state. FIG. 12 shows the situation after time t1. As shown in FIG. 12, the source as the output end of the amplifier transistor 14 is fixed at the drain voltage (VDD) of the voltage control transistor 61.

At time t2 after the reset transistor 13 is switched off, the voltage control transistor 61 is switched off. At time t3, as the select transistor 15 is switched on, the amplifier transistor 14 is connected to the column signal line 16 as shown in FIG. 13, and the potential of the source and under the gate of the amplifier transistor 14 becomes lower.

At this point of time, the potential under the gate of the amplifier transistor 14 is capacitively coupled to the charge retention unit 12 via the gate insulating film, and therefore, the voltage of the charge retention units 12 also drops. The amount of this decrease in voltage depends on the variation in the voltage under the gate and of the source of the amplifier transistor 14. Since the voltage under the gate and of the source of the amplifier transistor 14 is fixed at a constant value by the voltage control transistor 61 in all of the pixels in the previous situation shown in FIG. 12, the variation in the voltage of the charge retention unit 12 at the time when the select transistor 15 is switched on is reduced.

Figure 13:
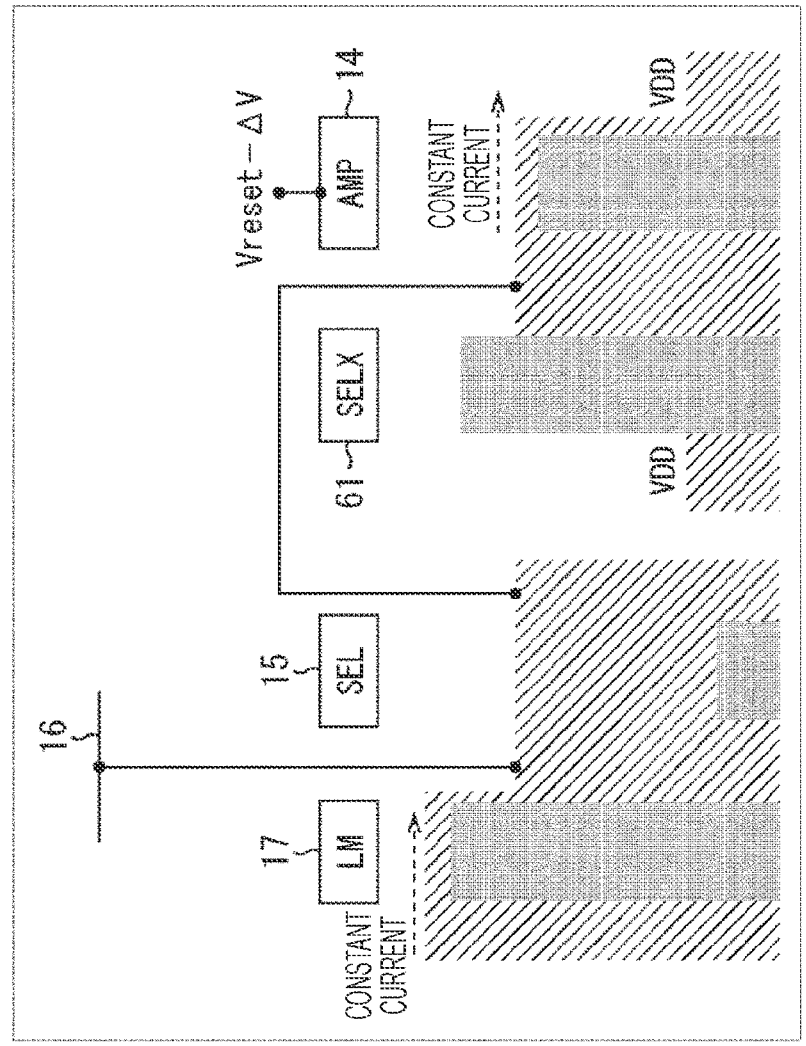
FIG. 13 is a diagram for explaining driving of the pixel according to the first embodiment.

In the situation shown in FIG. 13, the output level of the amplifier transistor 14 is read out as the reset signal level via the column signal line 16, and stored into a memory or the like in the AD converter.

After that, the select transistor 15 is switched off at time t4. At time t5, the voltage control transistor 61 is switched on, and signal accumulation in the pixel 51A is then started.

Figure 14:
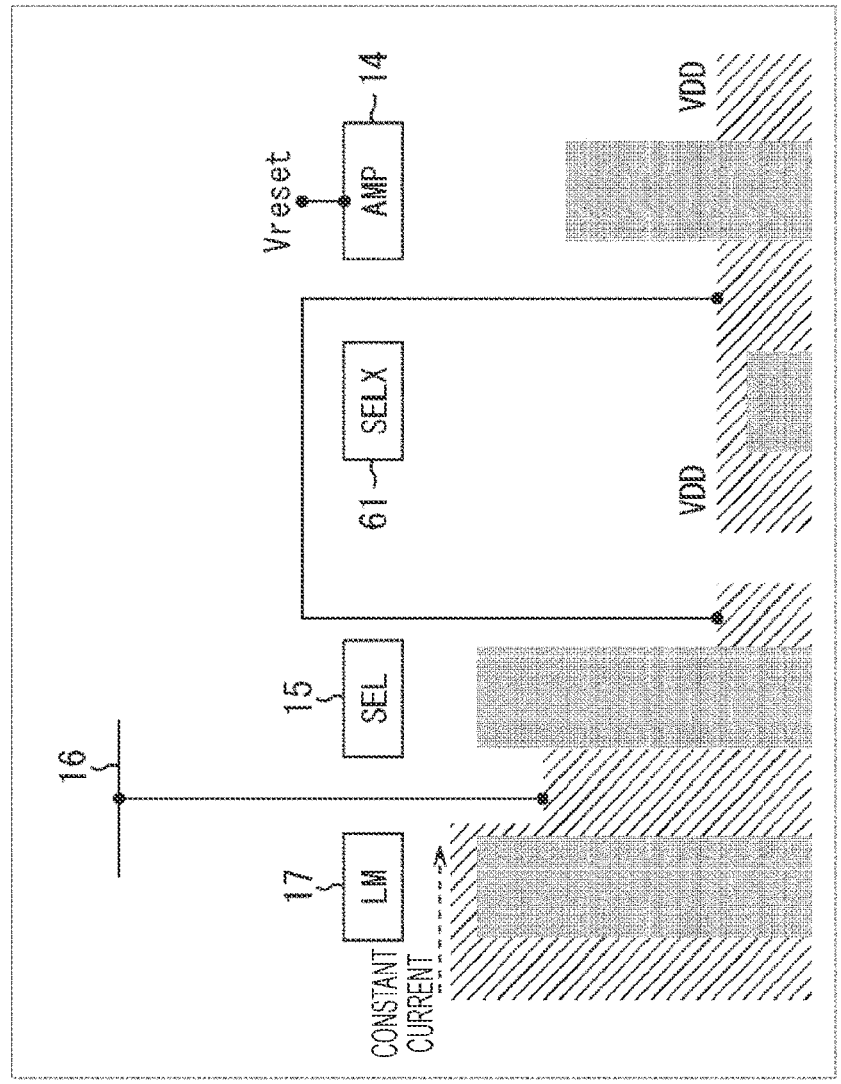
FIG. 14 is a diagram for explaining driving of the pixel according to the first embodiment.

FIG. 14 shows the situation during the signal accumulation (after time t5).

During the signal accumulation, the output end of the amplifier transistor 14 is again fixed at the drain voltage of the voltage control transistor 61, as shown in FIG. 14, and the gate of the amplifier transistor 14, which serves as the charge retention unit 12, returns to the initial reset voltage.

After completion of the signal charge accumulation, the voltage control transistor 61 is switched off at time t6. At time t7, the select transistor 15 is switched on, so that the signal charge accumulated in the charge retention unit 12 is output to the memory or the like in the AD converter via the column signal line 16.

Figure 15:
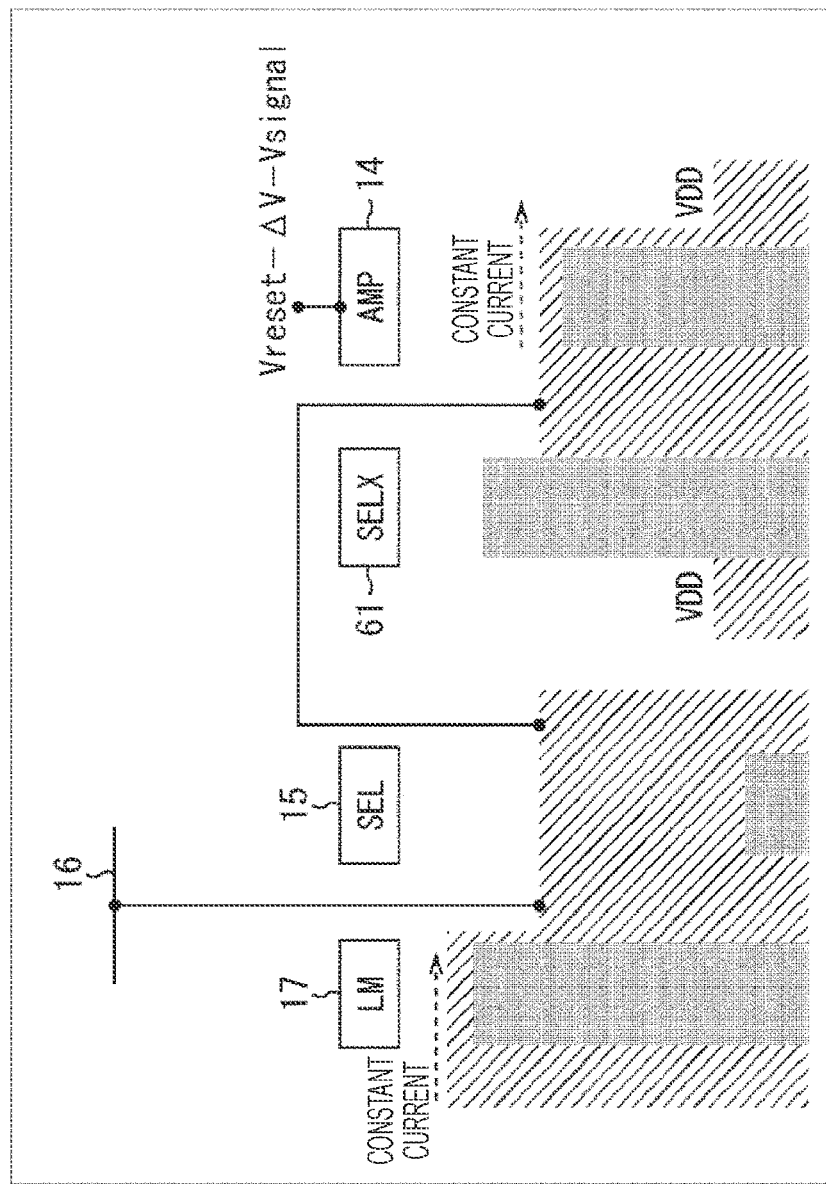
FIG. 15 is a diagram for explaining driving of the pixel according to the first embodiment.

FIG. 15 shows the situation during the output of the accumulated signal charge after time t7.

After the accumulated signal charge is read out, the select transistor 15 is switched off at time t8, and the voltage control transistor 61 is switched on at time t9.

In the first driving described above, the charge retention unit 12 during the signal accumulation period returns to the reset voltage (Vreset) of the initial state, and the variation in voltage disappears, as shown in FIG. 14. As a result, the variation in the leakage current of the charge retention unit 12 is made smaller, and point defect generation is reduced. The variation in the voltage to be applied to the photoelectric conversion film 28 is also reduced, and the variation in the sensitivity of the photoelectric conversion film 28 and the variation in the leakage current of the photoelectric conversion film 28 are made smaller.

Also, in the first driving, an operation to reset the charge retention unit 12 is performed while the select transistor 15 is in an off-state. Because of this, the period for performing the reset operation can overlap the period during which the select transistor 15 of another pixel is in an on-state. Thus, the speed of imaging of the solid-state imaging device can be increased.

Further, when the charge retention unit 12 is reset, the potential of the output end and under the gate of the amplifier transistor 14 is fixed by the voltage control transistor 61, so that the variation in the reset voltage at the time when the select transistor 15 is switched on can be reduced. Thus, degradation of the imaging quality of the solid-state imaging device can be reduced.

Note that, in the timing chart in FIG. 11, if the select transistor 15 is switched on before the voltage control transistor 61 is switched off at time t2, the drain voltage of the voltage control transistor 61 is output to the column signal line 16. As a result, a certain time is required for stabilization between the time when the voltage control transistor 61 is switched off and the time when the output of the amplifier transistor 14 is reflected by the column signal line 16. In view of this, driving is preferably performed so that the voltage control transistor 61 is invariably in an off-state while the select transistor 15 is in an on-state.

Also, to fix the voltage of the output end (source) of the amplifier transistor 14 without fail, the voltage control transistor 61 is preferably formed with a deep-depletion transistor. Also, the off-state voltage of the voltage control transistor 61 is preferably a negative bias. Consequently, phenomena in which off-state leakage from the column signal line 16 occurs in the voltage control transistor 61 while the select transistor 15 is in an on-state can be reduced or prevented.

In the first embodiment, the drain voltage of the voltage control transistor 61 is equal to the drain voltage of the amplifier transistor 14. Thus, the types of power to be supplied to the pixel 51A can be reduced, and the pixel lines can be simplified.

Second Embodiment

Referring now to FIGS. 16 through 21, a second embodiment of a pixel to which the present technology is applied is described.

Figure 16:
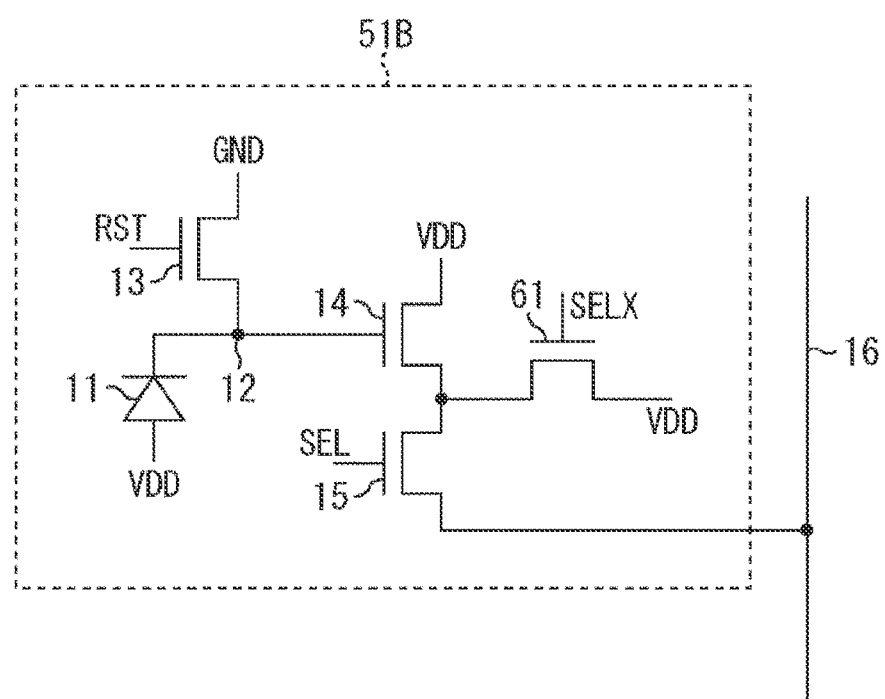
FIG. 16 is a diagram showing an equivalent circuit of a pixel according to a second embodiment.
Figure 17:
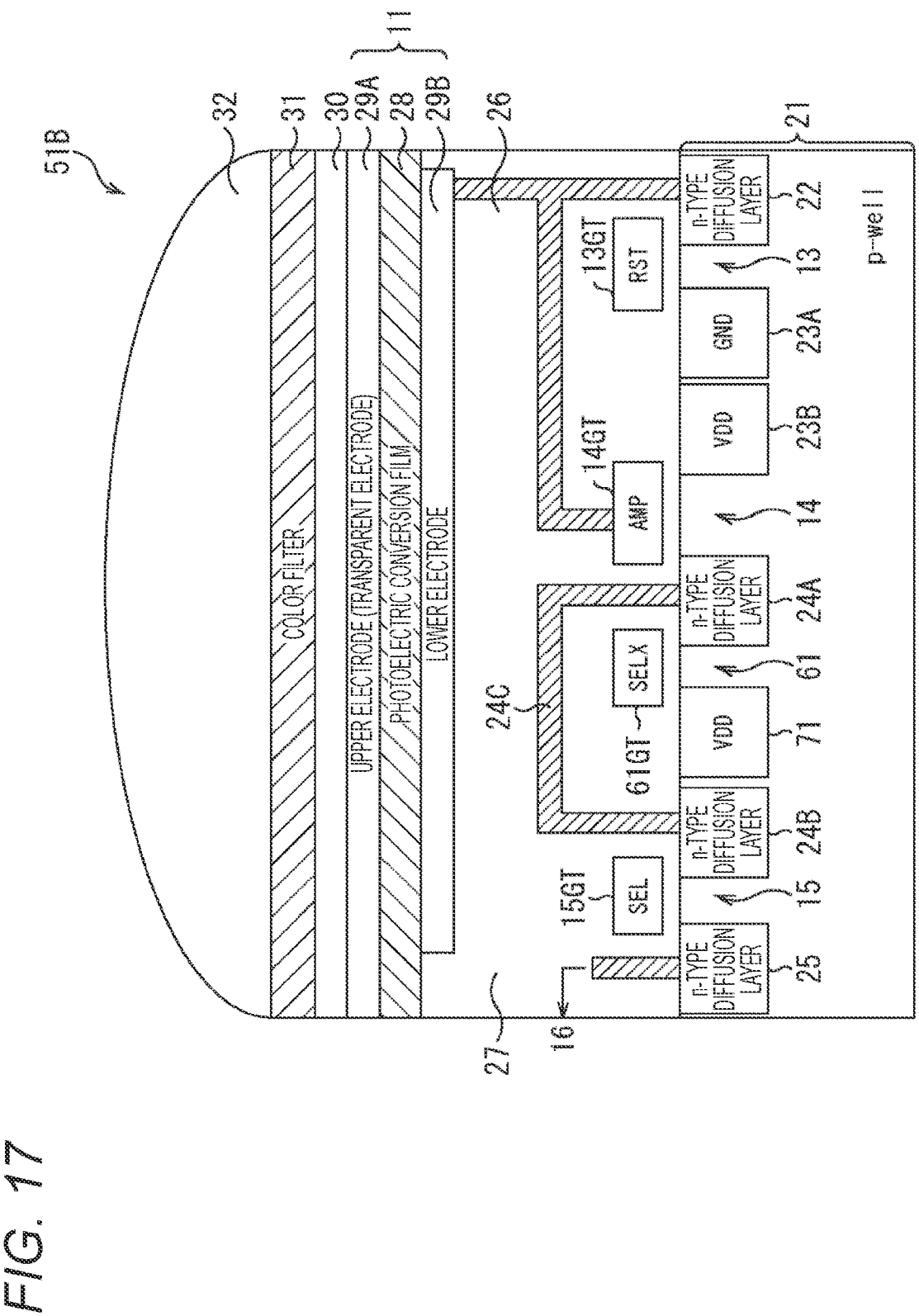
FIG. 17 is a diagram showing a cross-section structure of the pixel according to the second embodiment.

FIG. 16 is an equivalent circuit of a pixel 51B according to the second embodiment. FIG. 17 shows a cross-section structure of the pixel 51B according to the second embodiment.

The first embodiment is a structure that uses electrons as signal charge, and the second embodiment differs from the first embodiment in that holes are used as signal charge.

As is apparent from a comparison between the equivalent circuit of the pixel 51B shown in FIG. 16 and the pixel 51A shown in FIG. 9, the power supply voltage VDD is applied to one end of the photoelectric conversion unit 11, or the upper electrode 29A in FIG. 17, in the second embodiment. The amplifier transistor 14 is preferably formed with a deep-depletion transistor so as to operate as a source follower even at a low gate voltage.

The reset transistor 13 is connected not to the power supply voltage VDD but to GND. In FIG. 10 showing the first embodiment, the n-type diffusion layer 23 in the p-type semiconductor substrate 21 is shared between the reset transistor 13 and the amplifier transistor 14. In the second embodiment, however, an n-type diffusion layer 23A for the reset transistor 13 and an n-type diffusion layer 23B for the amplifier transistor 14 are formed separately from each other, as shown in FIG. 17. The n-type diffusion layer 23A for the reset transistor 13 is connected to GND, and the n-type diffusion layer 23B for the amplifier transistor 14 is connected to the power supply voltage VDD.

<Second Driving>

Figure 18:
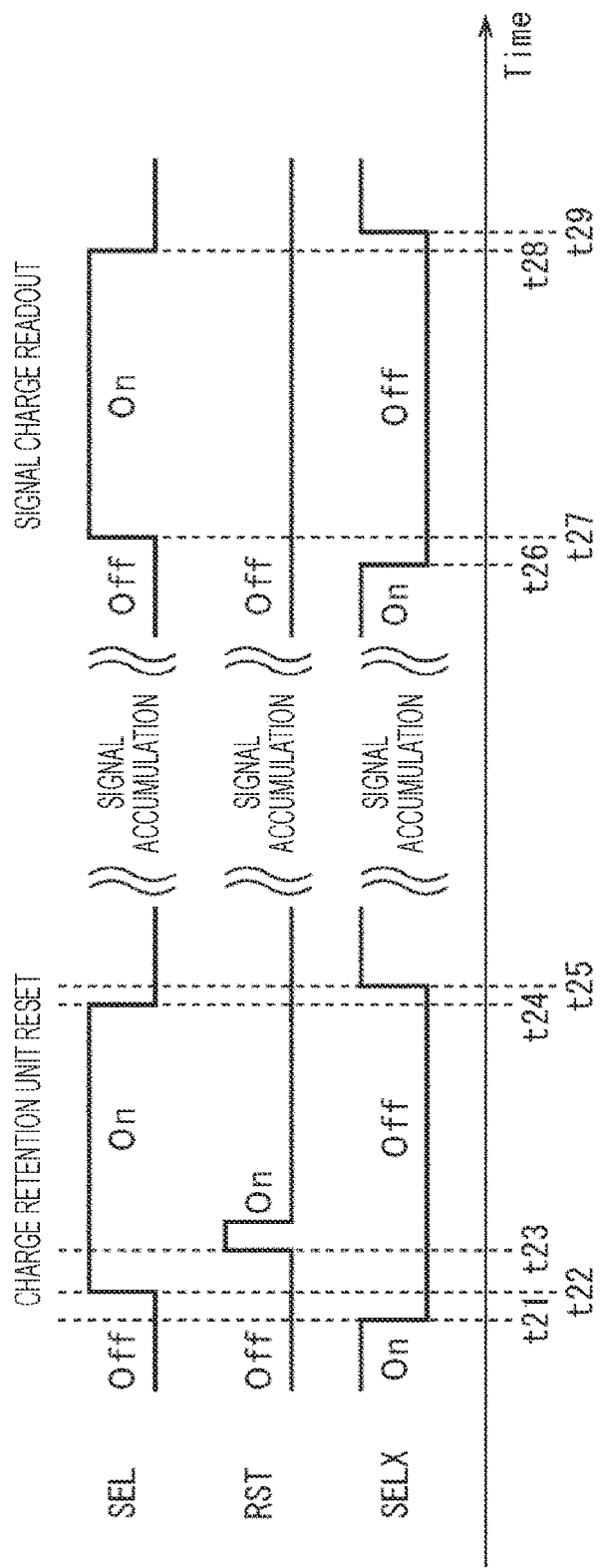
FIG. 18 is a diagram for explaining driving of the pixel according to the second embodiment.
Figure 19:
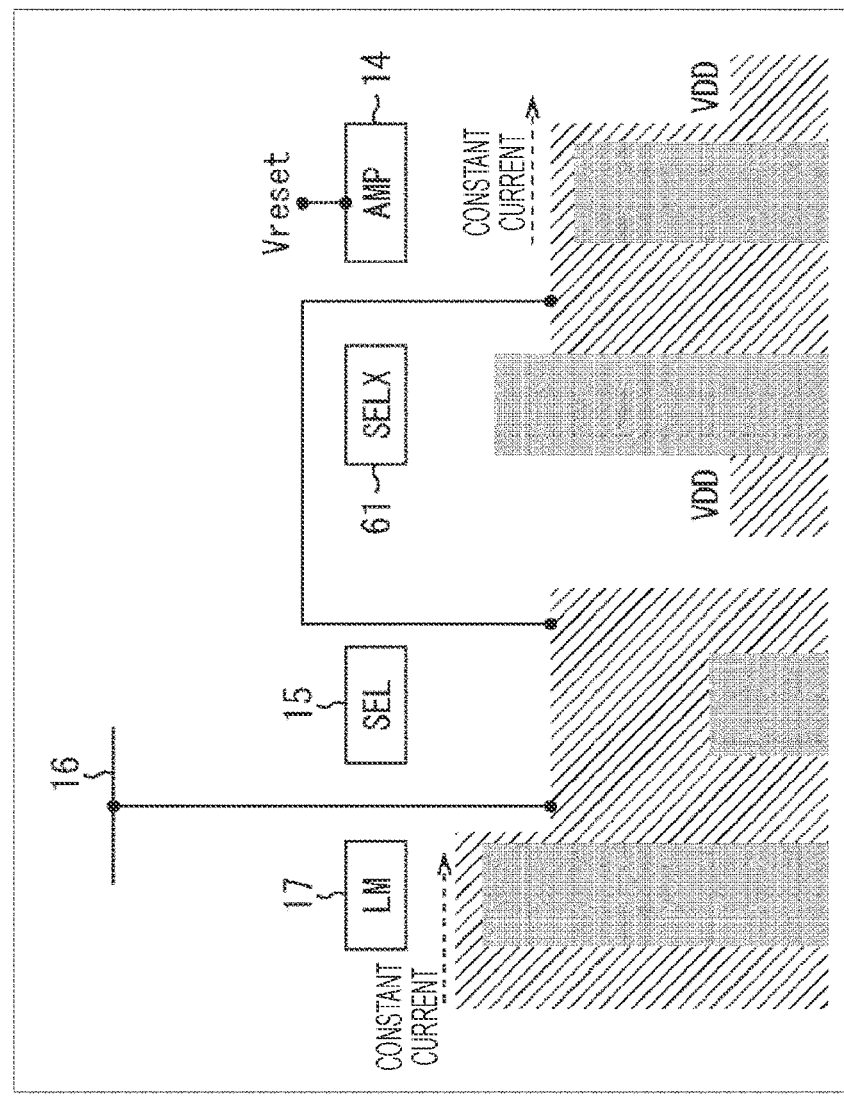
FIG. 19 is a diagram for explaining driving of the pixel according to the second embodiment.
Figure 20:
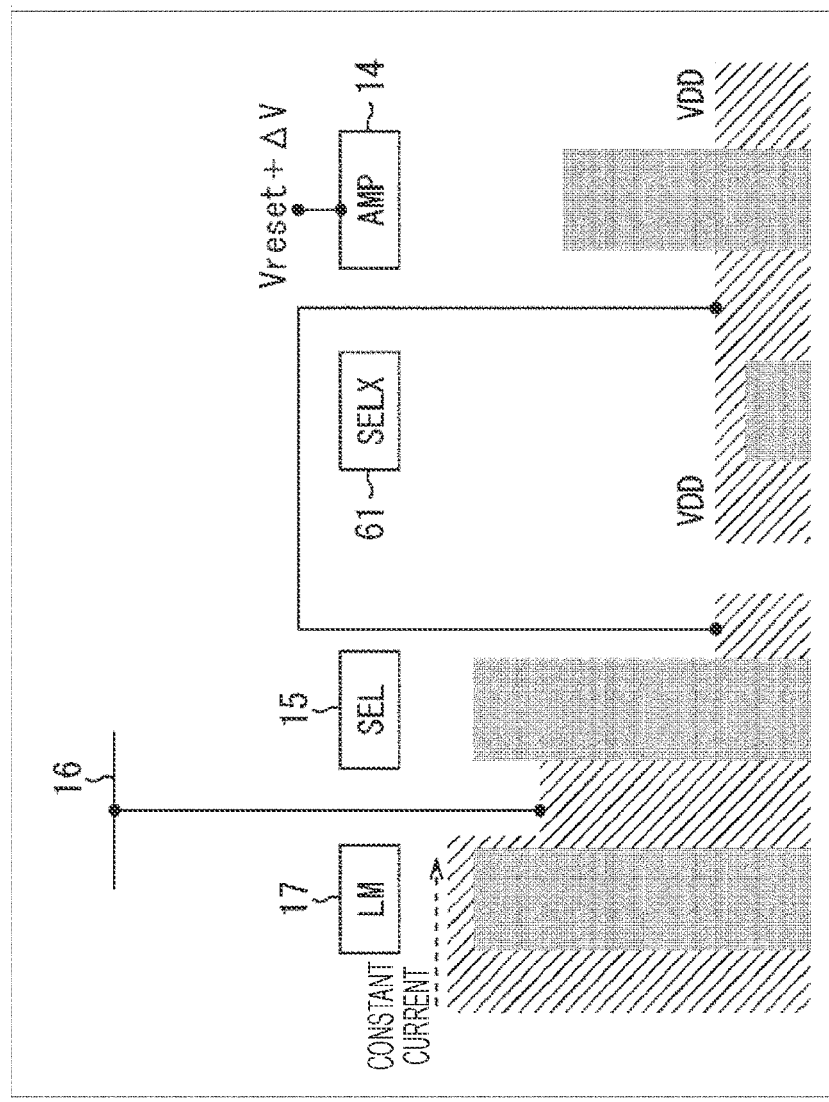
FIG. 20 is a diagram for explaining driving of the pixel according to the second embodiment.
Figure 21:
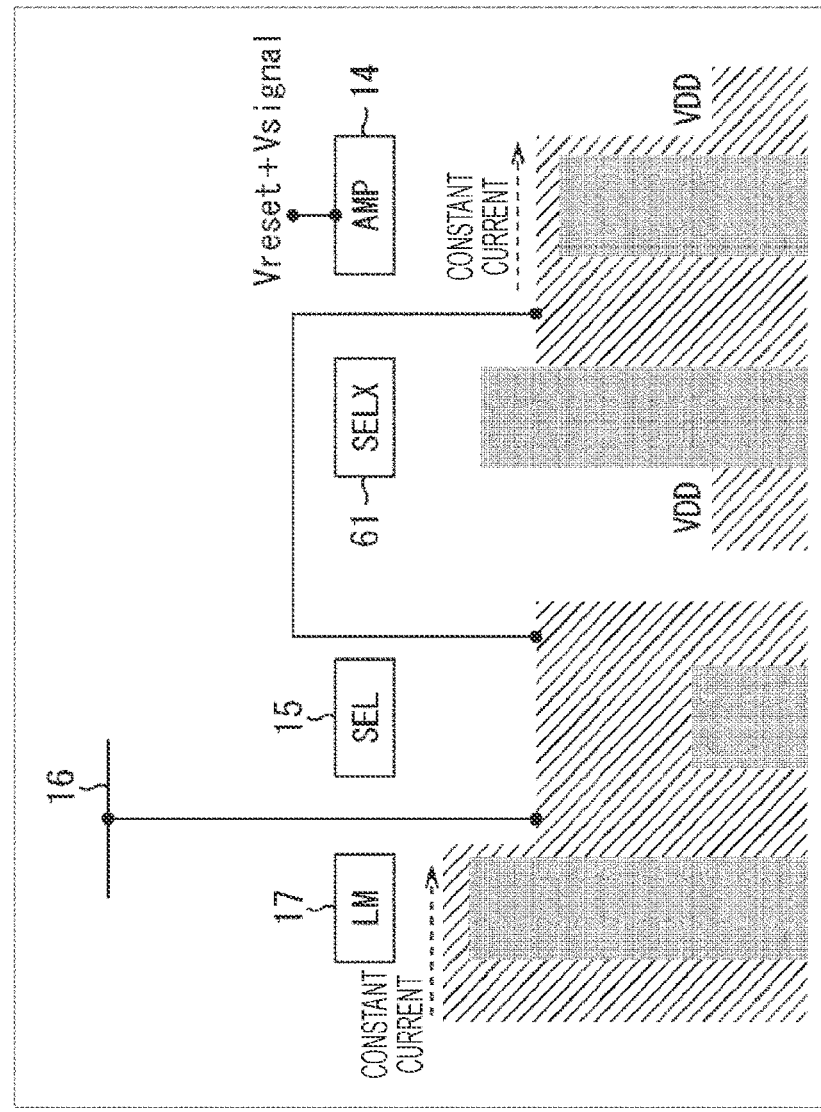
FIG. 21 is a diagram for explaining driving of the pixel according to the second embodiment.

Referring now to FIGS. 19 through 21 in conjunction with the timing chart in FIG. 18 as in the first embodiment, driving (second driving) of the pixel 51B according to the second embodiment is described.

At time t21, the voltage control transistor 61 is switched off. At time t22, the select transistor 15 is switched on. At time t23, the reset transistor 13 is switched on, and the voltage of the charge retention unit 12 is reset to the initial state.

FIG. 19 shows the situation during the reset signal level readout after the reset operation. In the situation shown in FIG. 19, the reset signal level of the pixel 51B is output from the amplifier transistor 14 to a memory or the like in the AD converter via the column signal line 16.

The select transistor 15 is switched off at time t24, and the voltage control transistor 61 is switched on at time t25. FIG. 20 shows the situation after time t25, and signal charge is accumulated in this situation.

In the situation shown in FIG. 20, the potential under the gate of the amplifier transistor 14 is capacitively coupled to the charge retention unit 12 via the gate insulating film, and therefore, the voltage of the charge retention units 12 also rises. The amount of this increase in voltage depends on the variation in the voltage under the gate and of the source of the amplifier transistor 14. Since the voltage under the gate and of the source of the amplifier transistor 14 is fixed at a constant value by the voltage control transistor 61 in all of the pixels, variation in the potential of the charge retention unit 12 is reduced. While the variation in the potential of the charge retention unit 12 is reduced, signal charge is accumulated.

After completion of the signal charge accumulation, the voltage control transistor 61 is switched off at time t26. At time t27, the select transistor 15 is switched on, so that the signal charge accumulated in the charge retention unit 12 is output to the memory or the like in the AD converter via the column signal line 16.

FIG. 21 shows the situation during the output of the accumulated signal charge.

After the accumulated signal charge is read out, the select transistor 15 is switched off at time t28, and the voltage control transistor 61 is switched on at time t29.

In the second driving described above, the variation in the voltage of the charge retention unit 12 at the time when the select transistor 15 is switched off is restricted to a constant value, as shown in FIG. 20. Thus, the variation in the voltage of the charge retention unit 12 is reduced during the signal accumulation period. As a result, the variation in the leakage current of the charge retention unit 12 is made smaller, and point defect generation is reduced. The variation in the voltage to be applied to the photoelectric conversion film 28 is also reduced, and the variation in the sensitivity of the photoelectric conversion film 28 and the variation in the leakage current of the photoelectric conversion film 28 are made smaller.

Also, in the second embodiment, holes are used as signal charge, and the GND voltage equal to the potential of the p-type semiconductor substrate 21 is used in resetting the charge retention unit 12. With this, a difference in potential between the n-type diffusion layer 22 of the charge retention unit 12 and the portion of the p-type semiconductor substrate 21 surrounding the n-type diffusion layer 22 in darkness can be greatly reduced. Thus, leakage current can be reduced.

Further, in the second embodiment, boosting of the charge retention unit 12 during the signal accumulation period is controlled by the voltage control transistor 61, as shown in FIG. 20. In a case where GND is used as the reset voltage, the voltage after an actual reset operation normally turns into a negative bias due to field-through, and a forward bias current is generated in the charge retention unit 12. To counter this, the charge retention unit 12 is boosted as in the second driving, so that the negative bias can be reset. Consequently, the generation in the forward bias current in the charge retention unit 12 is reduced, and degradation of the imaging quality of the solid-state imaging device can be reduced or prevented.

Note that, the amount of the increase in the voltage of the charge retention unit 12 can be adjusted to any appropriate value by controlling parameters, such as the drain voltage of the voltage control transistor 61, the amount of current in the load MOS 17 as a constant current source, the threshold voltage Vth of the amplifier transistor 14, and the transistor sizes. In a case where the pixel 51B is made to function as a field-through cancel circuit, the above mentioned parameters can be set at appropriate values in accordance with the field-through amount at the reset transistor 13.

Note that, in the second embodiment that uses holes as signal charge, if different voltages are used between the amplifier transistor 14 and the voltage control transistor 61, the voltage to be input to the amplifier transistor 14 rises at a time of reception of a large amount of light, and a large current is generated between the amplifier transistor 14 and the drain of the voltage control transistor 61. As the same drain voltage is used between the amplifier transistor 14 and the voltage control transistor 61 as in the above described second embodiment, generation of a large current can be prevented.

Third Embodiment

Referring now to FIGS. 22 through 28, a third embodiment of a pixel to which the present technology is applied is described.

Figure 22:
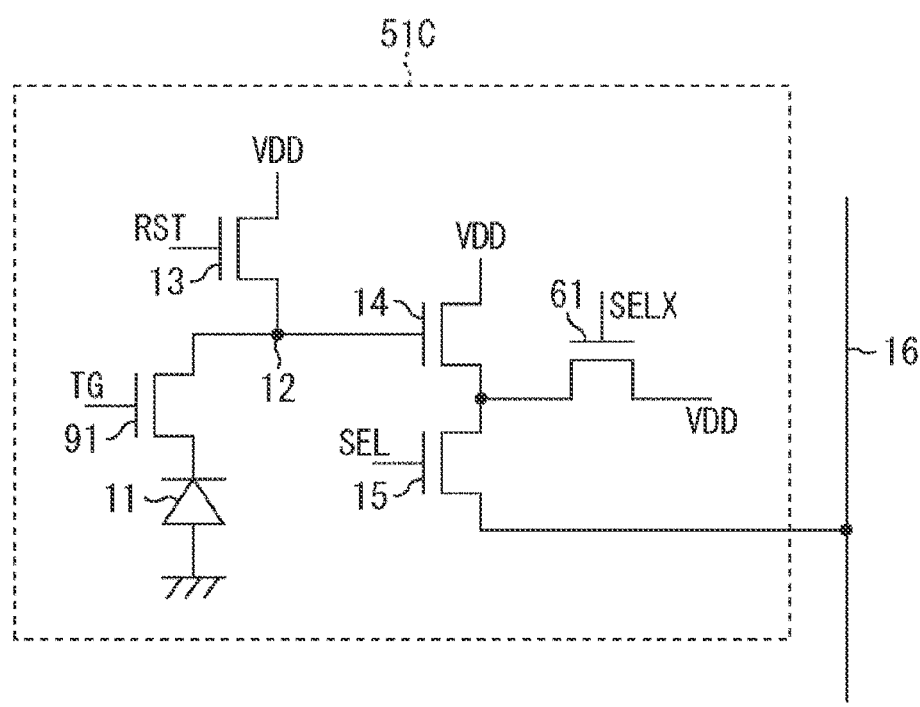
FIG. 22 is a diagram showing an equivalent circuit of a pixel according to a third embodiment.
Figure 23:
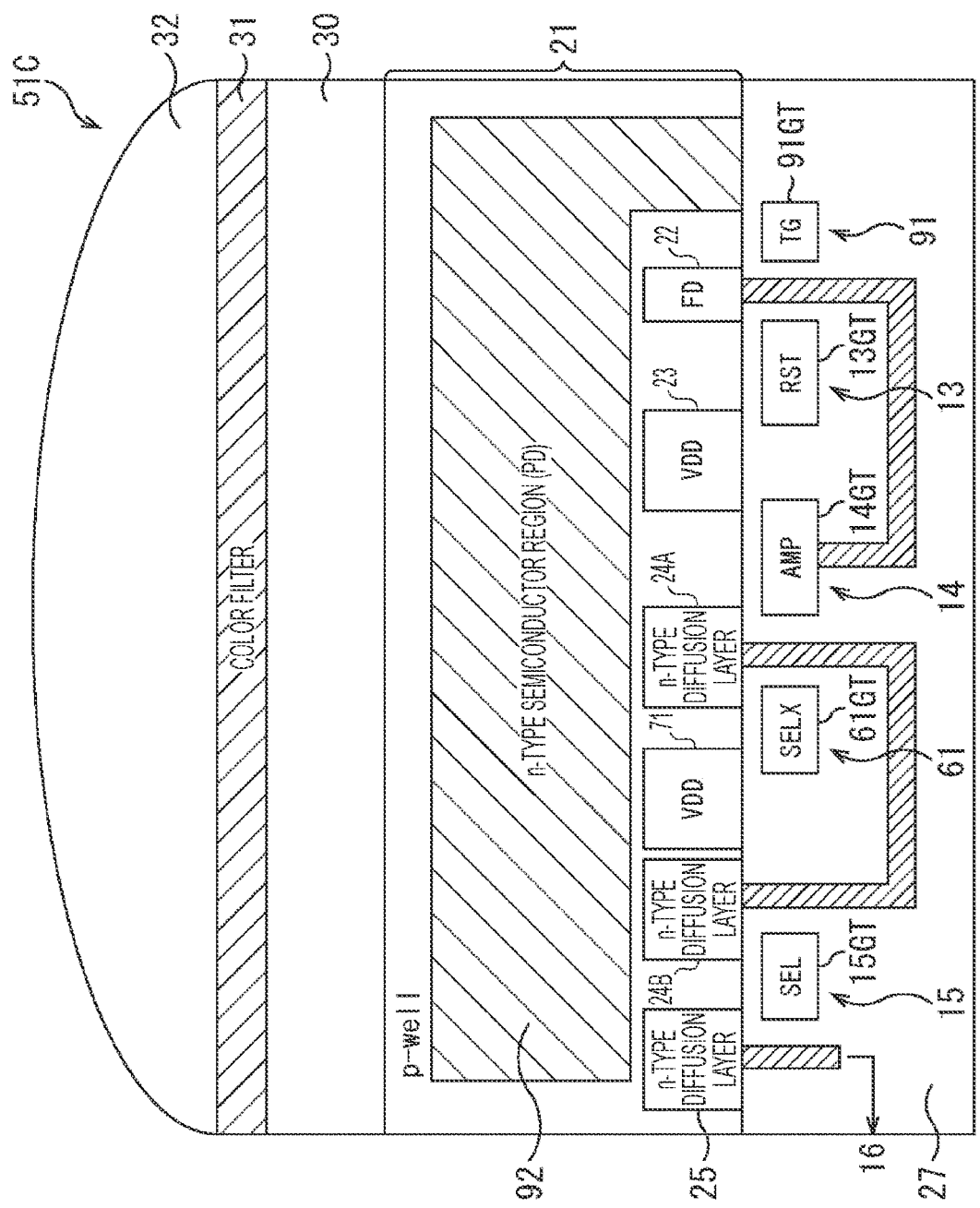
FIG. 23 is a diagram showing a cross-section structure of the pixel according to the third embodiment.

FIG. 22 is an equivalent circuit of a pixel 51C according to the third embodiment. FIG. 23 shows a cross-section structure of the pixel 51C according to the third embodiment.

In the above described first and second embodiments, the photoelectric conversion unit 11 and the amplifier transistor 14 are connected directly to each other in a pixel 51C.

In the pixel 51C according to the third embodiment, a transfer transistor 91 is added between the photoelectric conversion unit 11 and the amplifier transistor 14, as shown in FIG. 22. When switched on by a transfer signal TG supplied to its gate, the transfer transistor 91 transfers the charge generated in the photoelectric conversion unit 11 to the charge retention unit 12. The charge retention unit 12 in the third embodiment is a floating diffusion (FD) unit in an electrically floating state.

Also, the third embodiment also differs from the above described first and second embodiments in that the photoelectric conversion unit 11 of the pixel 51C is formed with a photodiode PD formed by the PN junction between the p-type semiconductor substrate 21 and an n-type semiconductor region 92, as shown in FIG. 23.

In the third embodiment, a protection film (an insulating film) 30, a color filter 31, and an on-chip lens 32 are formed on the upper surface of the p-type semiconductor substrate 21. This upper surface forms the light incidence plane. The reset transistor 13, the amplifier transistor 14, the select transistor 15, the voltage control transistor 61, and the transfer transistor 91 are formed on the lower surface of the p-type semiconductor substrate 21. This lower surface is on the opposite side from the side on which the on-chip lens 32 and the like are formed. Thus, the pixel 51C of the third embodiment has the structure of a back-illuminated solid-state imaging device that has light entering from the back surface side, which is the opposite side from the surface side of the p-type semiconductor substrate 21 on which the pixel transistors are formed.

Note that, due to the addition of the transfer transistor 91, the number of wiring lines increases in the pixel structure of the third embodiment. In view of this, it is preferable to employ the structure of a back-illuminated solid-state imaging device as shown in FIG. 23

In the cross-section structure of the pixel 51C shown in FIG. 23, the added transfer transistor 91 is formed with a gate portion 91GT below the p-type semiconductor substrate 21, the n-type semiconductor region 92, and the n-type diffusion layer 22. Excess charge generated through photoelectric conversion by the photodiode PD serving as the photoelectric conversion unit 11 is discharged to the n-type diffusion layer 22 as an FD unit, with the portion under the gate portion 91GT of the transfer transistor 91 serving as an overflow barrier. The other pixel transistors are the same as those of the first embodiment, except for being formed on the lower surface on the opposite side of the p-type semiconductor substrate 21 from the light incidence surface side.

<Third Driving>

Figure 24:
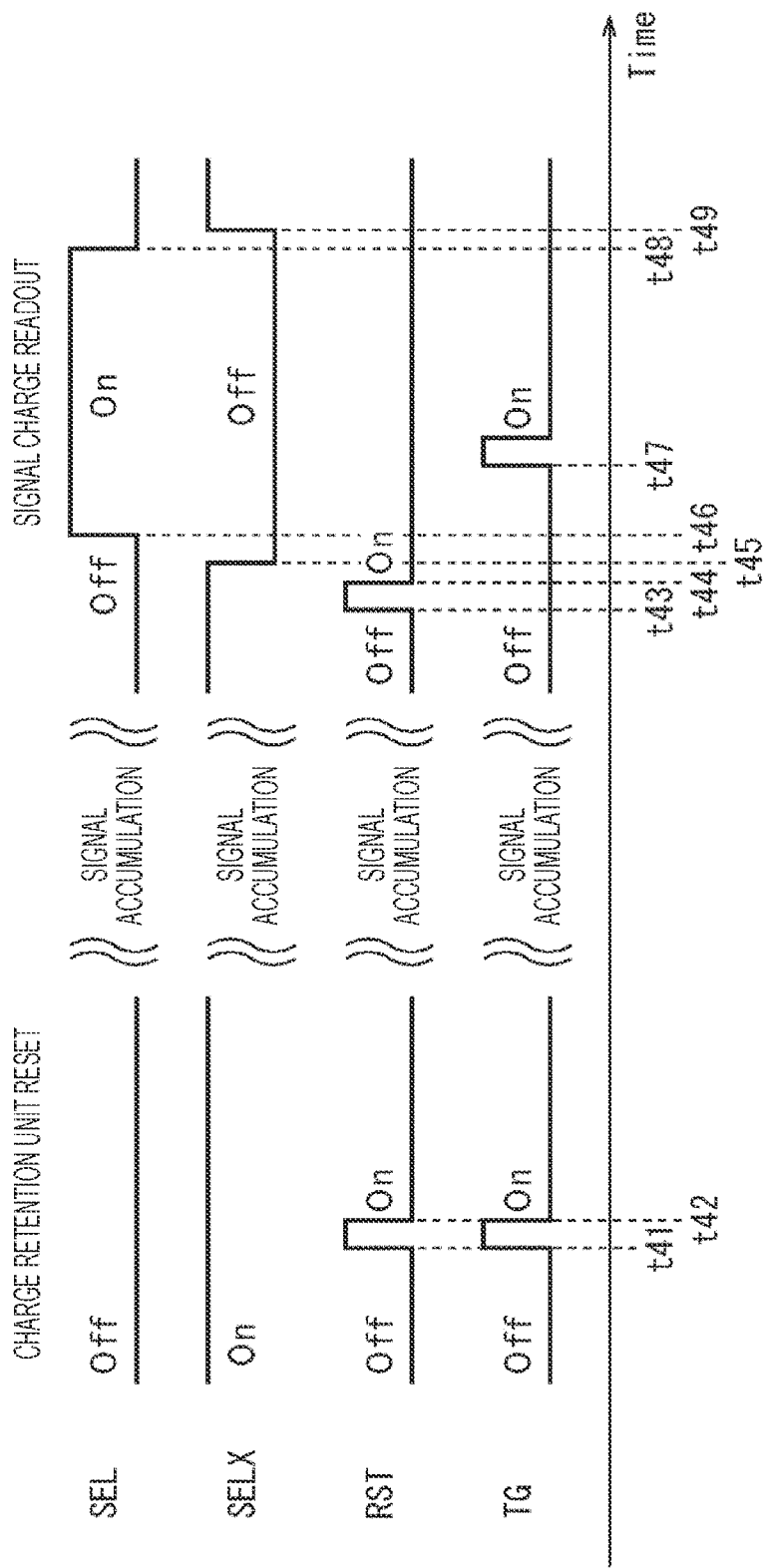
FIG. 24 is a diagram for explaining driving of the pixel according to the third embodiment.

Referring now to FIGS. 25 through 28 in conjunction with the timing chart in FIG. 24, driving (third driving) of the pixel 51C according to the third embodiment is described.

Figure 25:
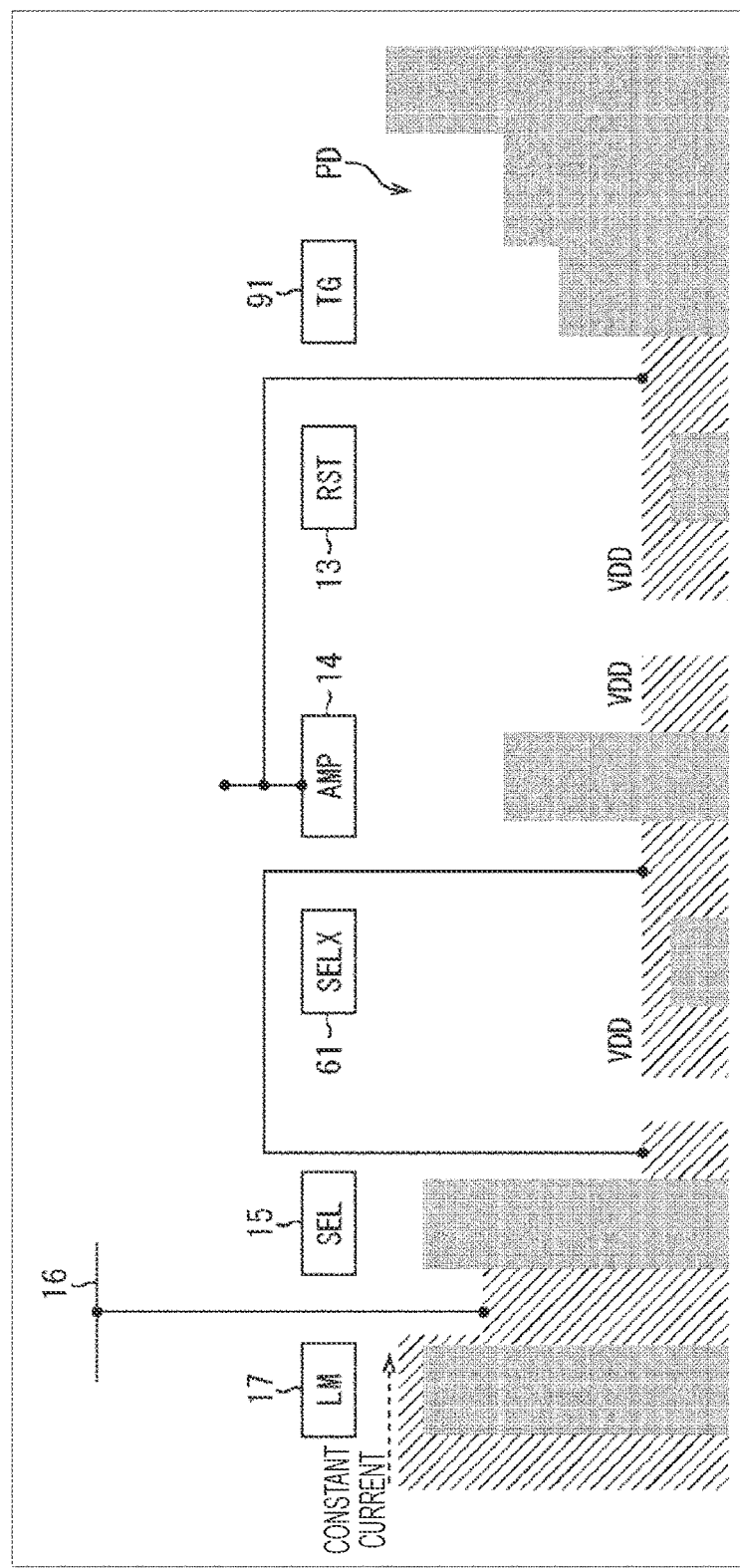
FIG. 25 is a diagram for explaining driving of the pixel according to the third embodiment.

At time t41 when the select transistor 15 is in an off-state and the voltage control transistor 61 is in an on-state, the reset transistor 13 and the transfer transistor 91 are switched on, and the photodiode PD as the photoelectric conversion unit 11 is reset. FIG. 25 shows the situation where the photodiode PD is reset after time t41.

Figure 26:
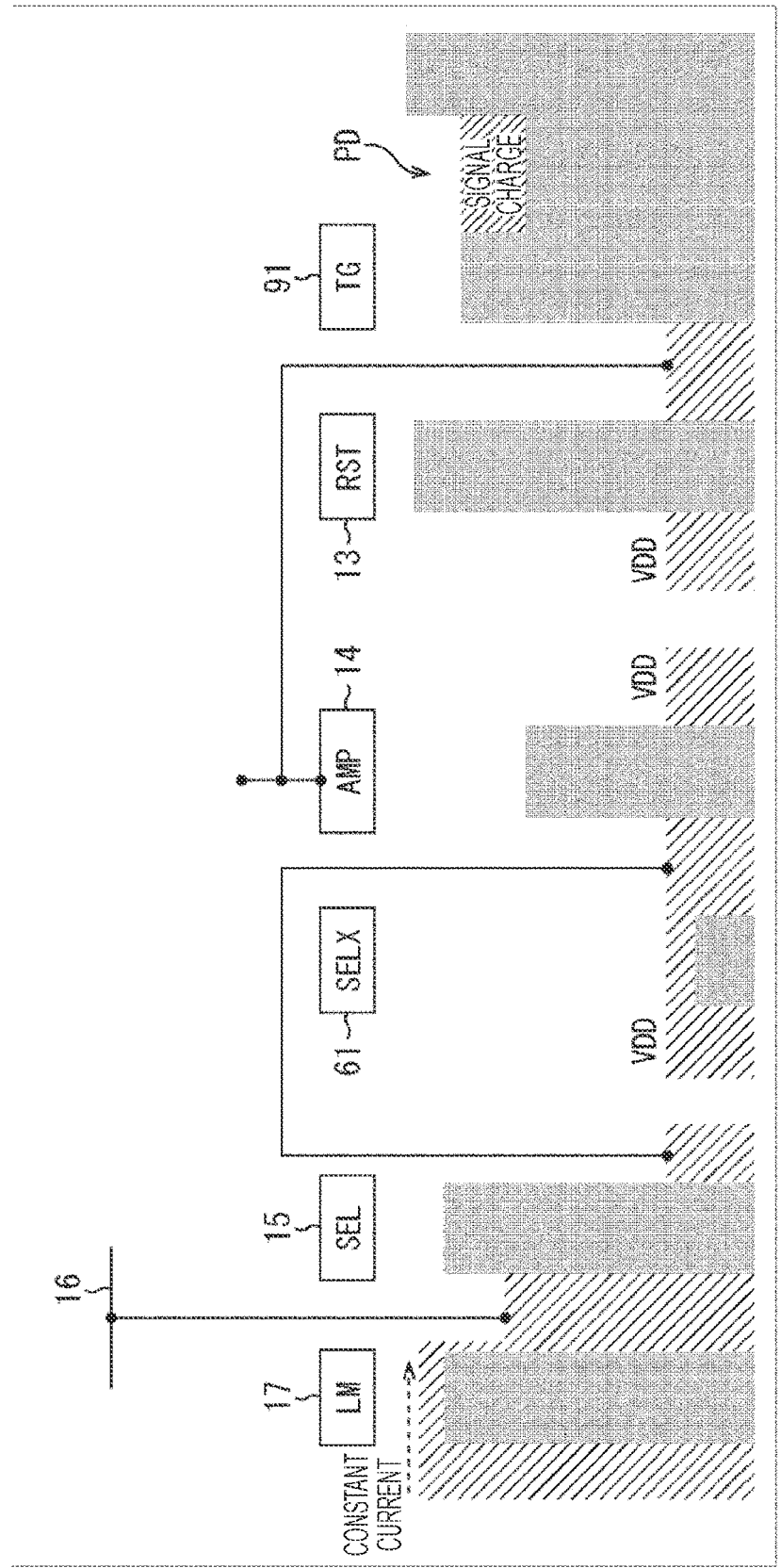
FIG. 26 is a diagram for explaining driving of the pixel according to the third embodiment.

At time t42, the reset transistor 13 and the transfer transistor 91 are switched off, and signal charge is accumulated in this situation. FIG. 26 shows the situation where signal charge is accumulated after time t42.

During the period from the reset of the photodiode PD till the signal accumulation, the source of the amplifier transistor 14 is fixed at a constant value (the drain voltage) by the voltage control transistor 61 in all of the pixels, and thus, variation in the voltage of the charge retention unit 12 as the FD unit is reduced.

Figure 27:
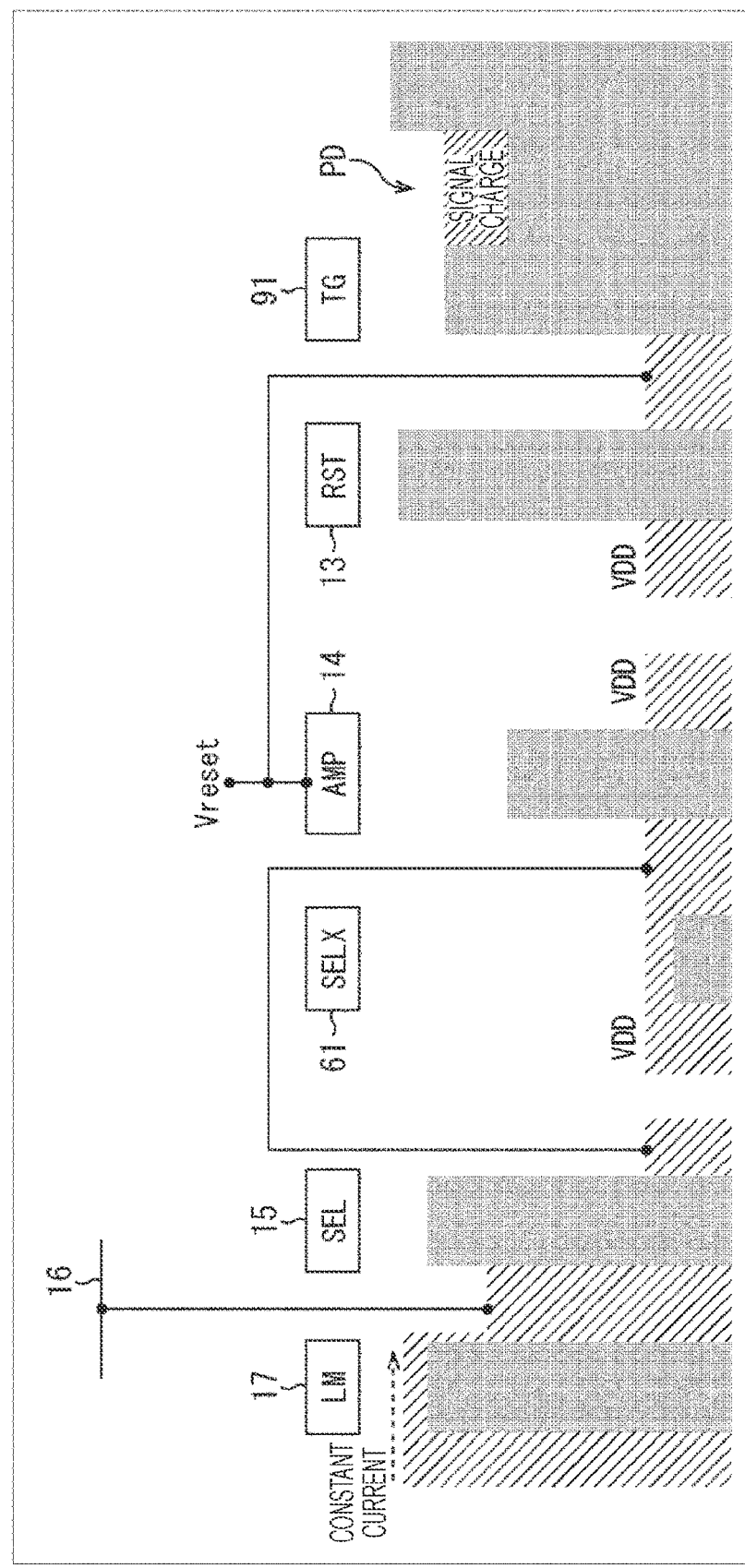
FIG. 27 is a diagram for explaining driving of the pixel according to the third embodiment.

After completion of the signal charge accumulation, the reset transistor 13 is switched on at time t43, and after a certain period of time, is switched off at time t44. Consequently, the charge retention unit 12 as the FD unit is again reset. FIG. 27 shows the situation after the reset. In this situation, the charge retention unit 12 (not shown) as the FD unit and the gate voltage of the amplifier transistor 14 connected to the charge retention unit 12 are at the reset voltage (Vreset).

Figure 28:
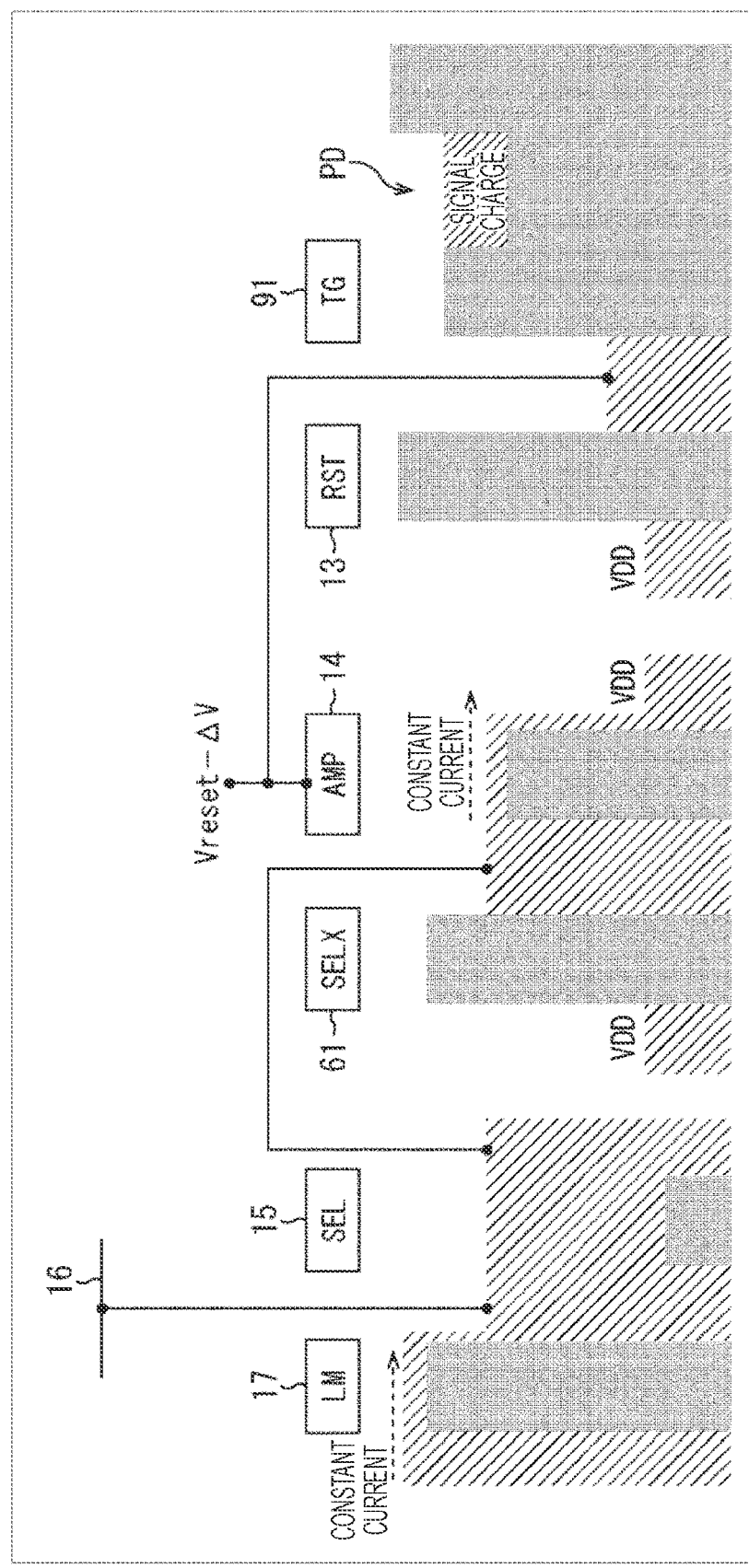
FIG. 28 is a diagram for explaining driving of the pixel according to the third embodiment.

The voltage control transistor 61 is switched off at time t45, and the select transistor 15 is switched on at time t46, so that the source as the output end of the amplifier transistor 14 is connected to the column signal line 16. Consequently, the potential of the source as the output end and under the gate of the amplifier transistor 14 becomes lower, as shown in FIG. 28. At this point of time, the potential under the gate of the amplifier transistor 14 is capacitively coupled to the charge retention unit 12 via the gate insulating film, and therefore, the voltage of the charge retention units 12 also drops. The amount of this decrease in voltage depends on the variation in the voltage under the gate and of the source of the amplifier transistor 14. Since the voltage under the gate and of the source of the amplifier transistor 14 is fixed at a constant value by the voltage control transistor 61 in all of the pixels in the situation shown in FIG. 27, variation in the potential of the charge retention unit 12 is reduced in the situation shown in FIG. 28. In view of this, the reset signal level is output from the amplifier transistor 14 to a memory or the like in the AD converter via the column signal line 16 while the variation in the potential of the charge retention unit 12 is reduced.

At time t47, the transfer transistor 91 is switched on, and the signal charge accumulated in the photodiode PD as the photoelectric conversion unit 11 is transferred to the charge retention unit 12, and is output from the amplifier transistor 14 to the column signal line 16.

After the accumulated signal charge is read out, the select transistor 15 is switched off at time t48, and the voltage control transistor 61 is switched on at time t49.

In the third driving described above, an operation to reset the charge retention unit 12 is performed while the select transistor 15 is in an off-state, as in the first driving. Because of this, the period for performing the reset operation can overlap the period during which the select transistor 15 of another pixel is in an on-state. Thus, the speed of imaging of the solid-state imaging device can be increased.

Further, when the charge retention unit 12 is reset, the potential of the output end and under the gate of the amplifier transistor 14 is fixed by the voltage control transistor 61, so that the variation in the reset voltage at the time when the select transistor 15 is switched on can be reduced. Thus, degradation of the imaging quality of the solid-state imaging device can be reduced.

In the third driving, the variation in the voltage of the charge retention unit 12 during the signal charge accumulation period is reduced. As a result, the variation in the overflow barrier under the gate of the transfer transistor 91 due to the voltage applied to the charge retention unit 12 is reduced. Thus, the variation in the saturation signal amount in the solid-state imaging device can be reduced.

Fourth Embodiment

Figure 29:
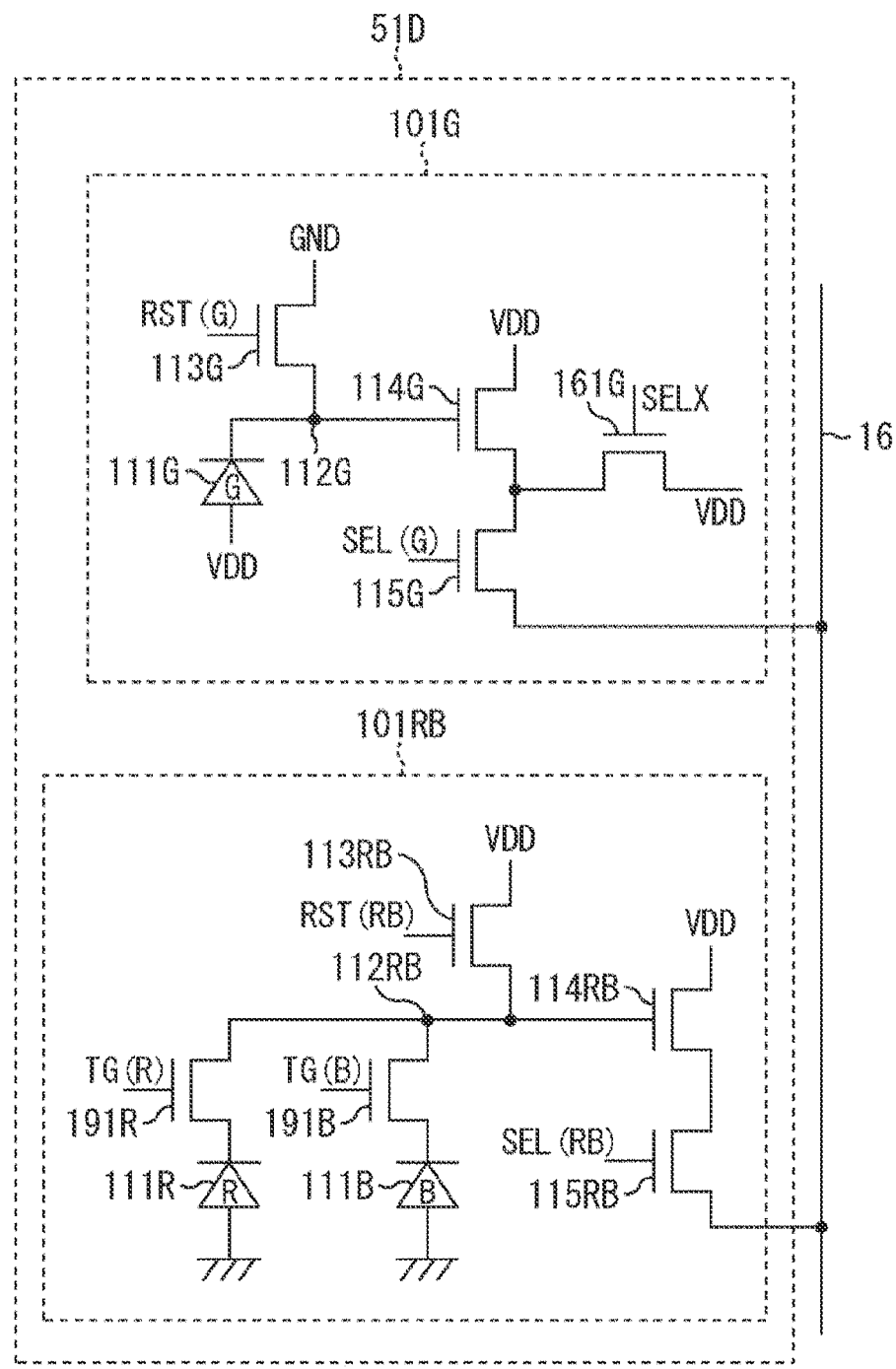
FIG. 29 is a diagram showing an equivalent circuit of a pixel according to a fourth embodiment.
Figure 30:
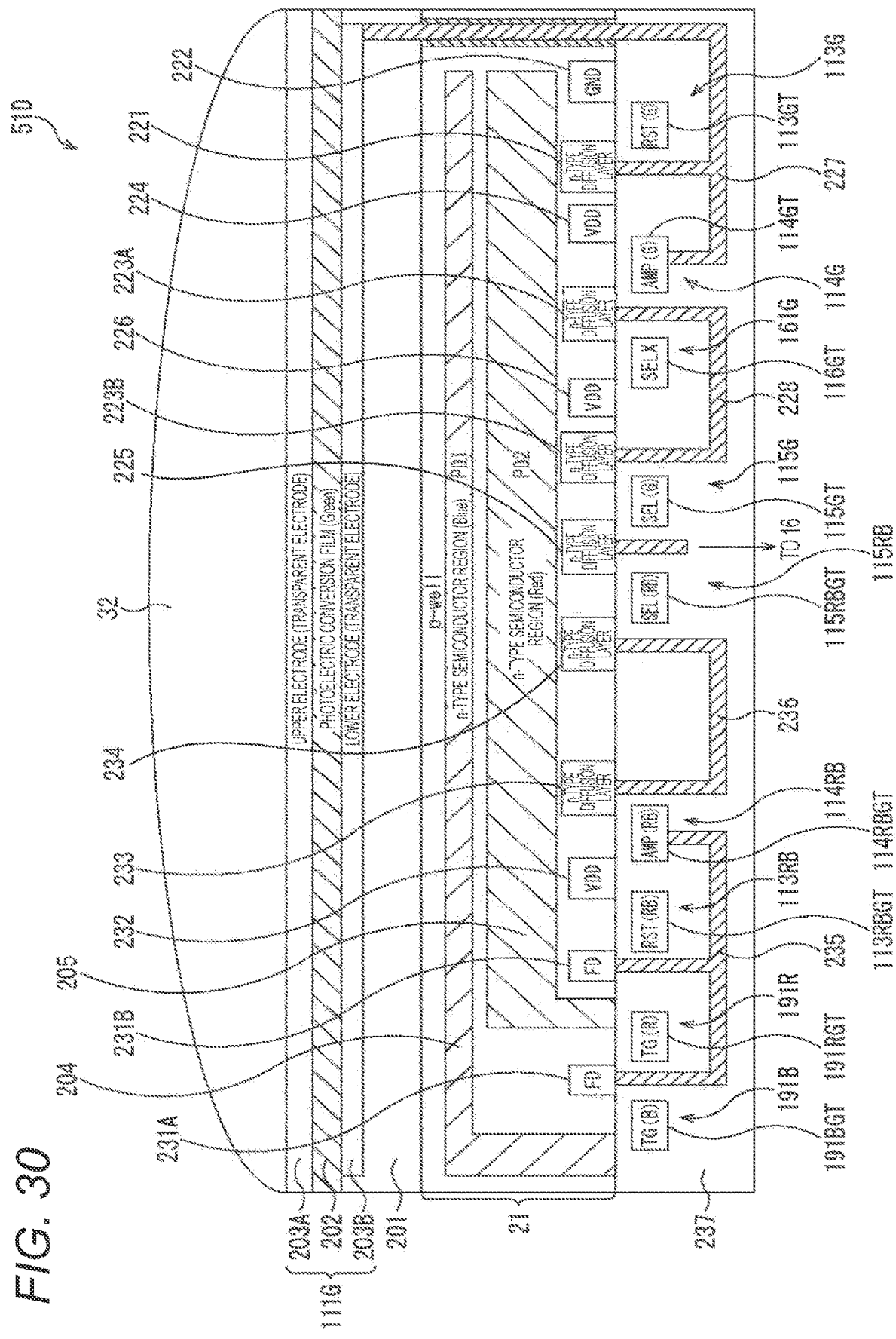
FIG. 30 is a diagram showing a cross-section structure of the pixel according to the fourth embodiment.
Figure 31:
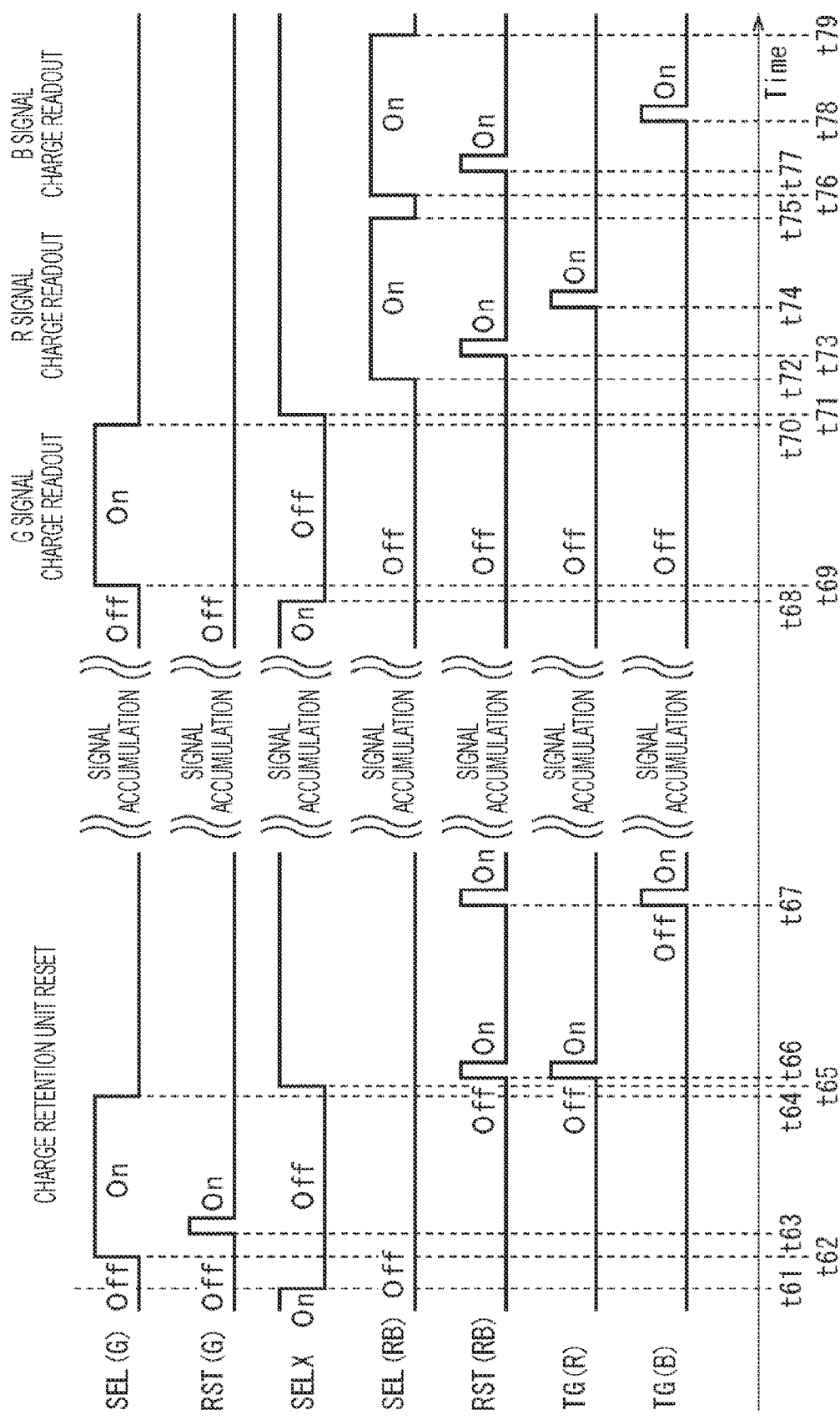
FIG. 31 is a diagram for explaining driving of the pixel according to the fourth embodiment.

Referring now to FIGS. 29 through 31, a fourth embodiment of a pixel to which the present technology is applied is described.

FIG. 29 shows an equivalent circuit of a pixel 51D according to the fourth embodiment.

As shown in FIG. 29, the equivalent circuit of the pixel 51D includes a pixel circuit 101G for green light as light of a first wavelength, and a pixel circuit 101RB for red light as light of a second wavelength and for blue light as light of a third wavelength.

The pixel circuit 101G for green light has the same structure as the pixel 51B of the second embodiment that uses holes as signal charge.

That is, the pixel circuit 101G includes a photoelectric conversion unit 111G, a charge retention unit 112G, a reset transistor 113G, an amplifier transistor 114G, a select transistor 115G, and a voltage control transistor 161G.

The photoelectric conversion unit 111G, the charge retention unit 112G, the reset transistor 113G, the amplifier transistor 114G, the select transistor 115G, and the voltage control transistor 161G of the pixel circuit 101G are equivalent to the photoelectric conversion unit 11, the charge retention unit 12, the reset transistor 13, the amplifier transistor 14, the select transistor 15, and the voltage control transistor 61 of the pixel 51B shown in FIG. 16, respectively.

This structure will be briefly described below.

The photoelectric conversion unit 111G generates and accumulates charge (signal charge) in accordance with the amount of received green light. While one end of the photoelectric conversion unit 111G is connected to the power supply voltage VDD, the other end is connected to the charge retention unit 112G, the reset transistor 113G, and the amplifier transistor 114G. In the structure of the pixel circuit 101G, the signal charge is holes.

The charge retention unit 112G retains charge read out from the photoelectric conversion unit 111G. As in the second embodiment, the charge retention unit 112G is connected to one end of the photoelectric conversion unit 111G, the source of the reset transistor 113G, and the gate of the amplifier transistor 114G, and therefore, the charge is retained by all of these components in practice.

When switched on by a reset signal RST(G) supplied to its gate, the reset transistor 113G resets the potential of the charge retention unit 112G.

The gate of the amplifier transistor 114G is connected to the charge retention unit 112G, the drain is connected to the power supply voltage VDD, and the source is connected to the drain of the select transistor 115G. The amplifier transistor 114G outputs a pixel signal in accordance with the potential of the charge retention unit 112G.

The drain of the select transistor 115G is connected to the source of the amplifier transistor 114G, and the source of the select transistor 115G is connected to a column signal line 16. When the pixel 51D is selected, the select transistor 115G is switched on by a select signal SEL(G) supplied to its gate, and outputs the pixel signal of the pixel 51D to an AD converter via the column signal line 16.

The drain of the voltage control transistor 161G is connected to the power supply voltage VDD, and the source of the voltage control transistor 161G is connected to the source of the amplifier transistor 114G and the drain of the select transistor 115G.

When switched on by a voltage control signal SELX supplied to its gate, the voltage control transistor 161G sets (fixes) the source of the amplifier transistor 114G at the power supply voltage VDD.

Meanwhile, the pixel circuit 101RB for red light and blue light includes a photoelectric conversion unit and a transfer transistor for red light, and a photoelectric conversion unit and a transfer transistor for blue light. The other components are shared between red light and blue light.

More specifically, the pixel circuit 101RB includes a photoelectric conversion unit 111R, a photoelectric conversion unit 111B, a transfer transistor 191R, a transfer transistor 191B, a charge retention unit 112RB, a reset transistor 113RB, an amplifier transistor 114RB, and a select transistor 115RB.

The photoelectric conversion unit 111R accumulates charge obtained by receiving red light and photoelectrically converting the red light. The photoelectric conversion unit 111B accumulates charge obtained by receiving blue light and photoelectrically converting the blue light.

When switched on by a transfer signal TG(R) supplied to its gate, the transfer transistor 191R transfers the signal charge generated in the photoelectric conversion unit 111R to the charge retention unit 112RB as an FD unit. When switched on by a transfer signal TG(B) supplied to its gate, the transfer transistor 191B transfers the signal charge generated in the photoelectric conversion unit 111B to the charge retention unit 112RB as an FD unit.

The charge retention unit 112RB retains the signal charge transferred from the photoelectric conversion unit 111R or 111B. The charge retention unit 112RB is an FD unit.

When switched on by a reset signal RST(RB) supplied to its gate, the reset transistor 113RB resets the potential of the charge retention unit 112RB.

The gate of the amplifier transistor 114RB is connected to the charge retention unit 112RB, the drain is connected to the power supply voltage VDD, and the source is connected to the drain of the select transistor 115RB. The amplifier transistor 114RB outputs a pixel signal in accordance with the potential of the charge retention unit 112RB.

The drain of the select transistor 115RB is connected to the source of the amplifier transistor 114RB, and the source of the select transistor 115RB is connected to a column signal line 16. The select transistor 115RB is switched on when the pixel 51D is selected by a select signal SEL(RB) supplied to its gate, and the select transistor 115RB outputs the pixel signal of the pixel 51D to the AD converter via the column signal line 16.

FIG. 30 shows a cross-section structure of the pixel 51D according to the fourth embodiment.

In the pixel 51D, the photoelectric conversion unit 111G is formed on the light incidence surface side of a p-type semiconductor substrate 21, with a protection film (an insulating film) 201 being interposed in between. The photoelectric conversion unit 111G is formed with a structure in which a photoelectric conversion film 202 is interposed between an upper electrode 203A and a lower electrode 203B. A material that photoelectrically converts green light but passes red light and blue light is used as the material of the photoelectric conversion film 202. An organic photoelectric conversion film that performs photoelectric conversion at the wavelength of green light may be an organic photoelectric conversion material containing a rhodamine dye, a merocyanine dye, quinacridone, or the like. Each of the upper electrode 203A and the lower electrode 203B is formed with a transparent electrode film, such as an indium tin oxide (ITO) film or an indium zinc oxide film.

Note that, in a case where the photoelectric conversion film 202 is an organic photoelectric conversion film that performs photoelectric conversion at the wavelength of red light, for example, an organic photoelectric conversion material containing a phthalocyanine dye can be used. In a case where the photoelectric conversion film 202 is an organic photoelectric conversion film that performs photoelectric conversion at the wavelength of blue light, for example, an organic photoelectric conversion material containing a coumarin dye, tris-8-hydroxyquinoline Al(Alq3), a merocyanine dye, or the like can be used. An on-chip lens 32 is formed on the upper side of the photoelectric conversion unit 111G.

In the p-type semiconductor substrate 21, two n-type semiconductor regions 204 and 205 are stacked in the depth direction, and photodiodes PD1 and PD2 are formed by the two PN junctions. Because of a difference in light absorption coefficient, the photodiode PD1 performs photoelectric conversion on blue light, and the photodiode PD2 performs photoelectric conversion on red light. The two n-type semiconductor regions 204 and 205 are designed to partially reach the interface on the lower side of the p-type semiconductor substrate 21.

The pixel transistors of the pixel 51D are formed on the lower surface on the opposite side of the p-type semiconductor substrate 21 from the side on which the photoelectric conversion unit 111G and the like are formed.

Specifically, the reset transistor 113G for green light is formed with a gate portion 113GT above the p-type semiconductor substrate 21, and n-type diffusion layers 221 and 222 in the p-type semiconductor substrate 21. The amplifier transistor 114G is formed with a gate portion 114GT above the p-type semiconductor substrate 21, and n-type diffusion layers 223A and 224 in the p-type semiconductor substrate 21.

Also, the select transistor 115G is formed with a gate portion 115GT above the p-type semiconductor substrate 21, and n-type diffusion layers 223B and 225 in the p-type semiconductor substrate 21. The voltage control transistor 116G is formed with a gate portion 116GT above the p-type semiconductor substrate 21, and n-type diffusion layers 223A and 226 in the p-type semiconductor substrate 21.

The signal charge generated as a result of reception of green light is holes, and the power supply voltage (VDD) is applied to the upper electrode 203A of the photoelectric conversion film 202. The lower electrode 203B of the photoelectric conversion film 202 is connected to the n-type diffusion layer 221, which is one of the source and the drain of the reset transistor 113G, and to the gate of the amplifier transistor 114G by a metal connection conductor 227. These connected components constitute the charge retention unit 112G. The n-type diffusion layer 222, which is the other one of the source and the drain of the reset transistor 113G, is connected to GND.

The n-type diffusion layers 223A and 223B are connected by a metal line 228, and serve as the source of the amplifier transistor 114G, the drain of the select transistor 115G, and the source of the voltage control transistor 116. The n-type diffusion layer 225 as the source of the select transistor 115G is connected to the column signal line 16.

Further, the transfer transistor 191B for blue light is formed with a gate portion 191BGT above the p-type semiconductor substrate 21, and the n-type semiconductor region 204 and an n-type diffusion layer 231A in the p-type semiconductor substrate 21. The transfer transistor 191R for red light is formed with a gate portion 191RGT above the p-type semiconductor substrate 21, and the n-type semiconductor region 205 and the n-type diffusion layer 231A in the p-type semiconductor substrate 21.

Also, the reset transistor 113RB is formed with a gate portion 113RBGT above the p-type semiconductor substrate 21, and n-type diffusion layers 231B and 232 in the p-type semiconductor substrate 21. The amplifier transistor 114RB is formed with a gate portion 114RBGT above the p-type semiconductor substrate 21, and n-type diffusion layers 232 and 233 in the p-type semiconductor substrate 21.

Further, the select transistor 115RB is formed with a gate portion 115RBGT above the p-type semiconductor substrate 21, and n-type diffusion layers 234 and 225 in the p-type semiconductor substrate 21.

The n-type diffusion layer 231A shared between the transfer transistor 191B for blue light and the transfer transistor 191R for red light is connected to the n-type diffusion layer 231B, which is one of the n-type diffusion layers of the reset transistor 113RB, and to the gate portion 114RBGT of the amplifier transistor 114RB by a metal line 235, to form the charge retention unit 112RB. The n-type diffusion layer 232 serving as the drain of the reset transistor 113RB and the drain of the amplifier transistor 114RB is connected to the power supply voltage VDD.

Also, the n-type diffusion layer 233, which is one of the n-type diffusion layers of the amplifier transistor 114RB, and the n-type diffusion layer 234, which is one of the n-type diffusion layers of the select transistor 115RB, are connected by a metal line 236. The n-type diffusion layer 225, which is the other one of the n-type diffusion layers of the select transistor 115RB, is shared with the select transistor 115 for the green light. The surface of the p-type semiconductor substrate 21 on which the pixel transistors are formed is coated with an insulating film 237.

Note that, although the n-type diffusion layers shared as the sources or the drains of the pixel transistors are connected by metal lines due to space limitations in FIG. 30, a single n-type diffusion layer may of course be shared.

<Fourth Driving>

Referring now to the timing chart in FIG. 31, driving (fourth driving) of the pixel 51D according to the fourth embodiment is described.

In the fourth driving, signal charge reset operations are performed on green signal charge, red signal charge, and blue signal charge in this order, and the green signal charge, the red signal charge, and the blue signal charge are read out in this order after the signal accumulation period has passed.

First, a green signal charge reset operation is performed. Specifically, at time t61, the voltage control transistor 161G for green light is switched off. At time t62, the select transistor 151G is switched on. At time t63, the reset transistor 113G is switched on, and the voltage of the charge retention unit 112G is reset to the initial state.

The select transistor 115G is switched off at time t64, and the voltage control transistor 161G is switched on at time t65.

Next, a red signal charge reset operation and a blue signal charge reset operation are performed.

Specifically, at time t66, the reset transistor 113RB for red light and blue light, and the transfer transistor 191R are switched on, and the photodiode PD2 as the photoelectric conversion unit 111R is reset.

At time t67, the reset transistor 113RB and the transfer transistor 191B are switched on, and the photodiode PD1 as the photoelectric conversion unit 111B is reset.

In the above manner, the operations to reset the green signal charge, the red signal charge, and the blue signal charge are completed. Signal charge accumulation is then started.

After completion of the signal charge accumulation, a green signal charge readout operation is first performed.

The voltage control transistor 161G for green light is switched off at time t68, and the select transistor 115G is switched on at time t69, so that the green signal charge accumulated in the charge retention unit 112G is output to a memory or the like in the AD converter via the column signal line 16.

After the accumulated green signal charge is read out, the select transistor 115G is switched off at time t70, and the voltage control transistor 161G is switched on at time t71.

Next, a red signal charge readout operation is performed.

After the select transistor 115RB for red light and blue light is switched on at time t72, the reset transistor 113RB is switched on at time t73, so that the charge retention unit 112RB as an FD unit is reset.

At time t74, the transfer transistor 191R for red light is switched on, and the red signal charge accumulated in the photodiode PD2 is transferred to the charge retention unit 112RB, and is output from the amplifier transistor 114RB to the column signal line 16. At time t75, the select transistor 115RB for red light and blue light is temporarily switched off.

Next, a blue signal charge readout operation is performed.

After the select transistor 115RB for red light and blue light is again switched on at time t76, the reset transistor 113RB is switched on at time t77, so that the charge retention unit 112RB as an FD unit is reset.

At time t78, the transfer transistor 191B for blue light is switched on, and the blue signal charge accumulated in the photodiode PD1 is transferred to the charge retention unit 112RB, and is output from the amplifier transistor 114RB to the column signal line 16. Lastly, at time t79, the select transistor 115RB for red light and blue light is switched off.

In the above fourth driving, the driving of the green signal charge is the same as that in the second driving.

In the pixel 51D of the fourth embodiment, the drain voltage of the voltage control transistor 161G is set at the power supply voltage VDD, which is the same as the drain voltage of the amplifier transistor 114G in the pixel circuit 101G and the drain voltage of the reset transistor 113RB and the amplifier transistor 114RB in the pixel circuit 101RB. Thus, the types of power to be supplied to the pixel 51D can be reduced, and the pixel lines can be simplified.

Also, it is possible to prevent generation of a large current between the amplifier transistor 114G and the drain of the voltage control transistor 161G due to an increase in the voltage to be input to the amplifier transistor 114G at a time of reception of a large amount of light, as in the second embodiment.

Fifth Embodiment

Figure 32:
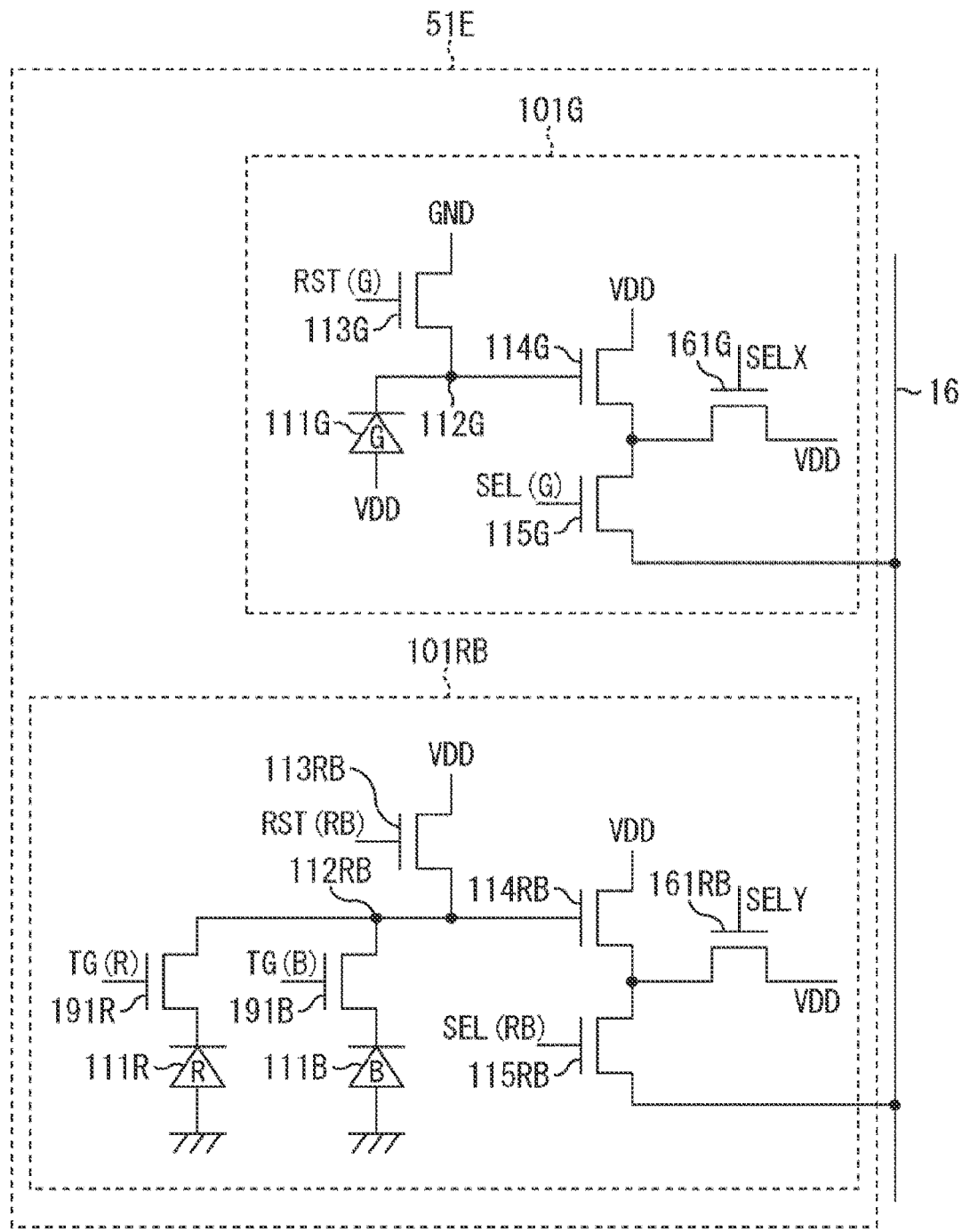
FIG. 32 is a diagram showing an equivalent circuit of a pixel according to a fifth embodiment.
Figure 33:
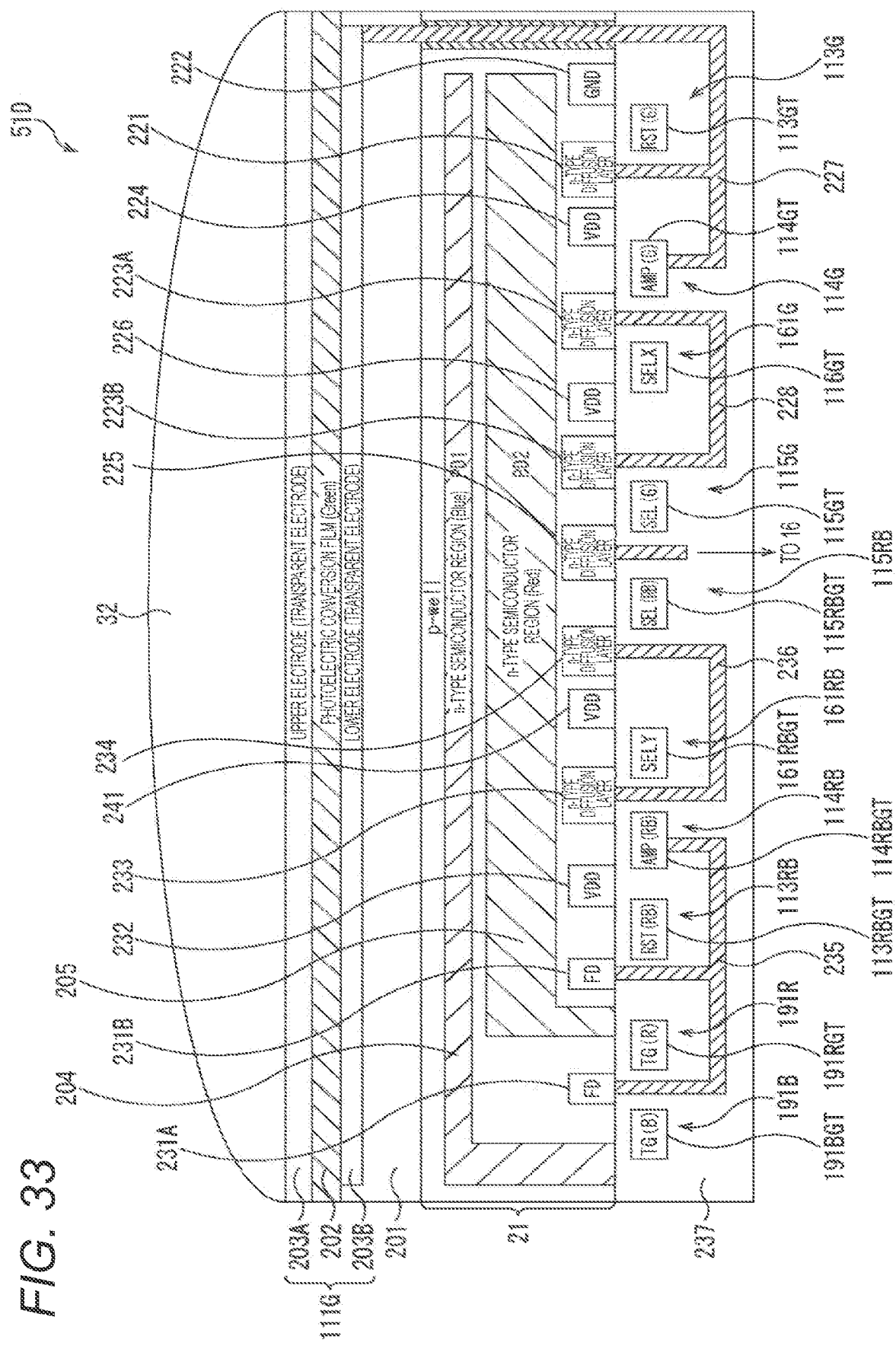
FIG. 33 is a diagram showing a cross-section structure of the pixel according to the fifth embodiment.
Figure 34:
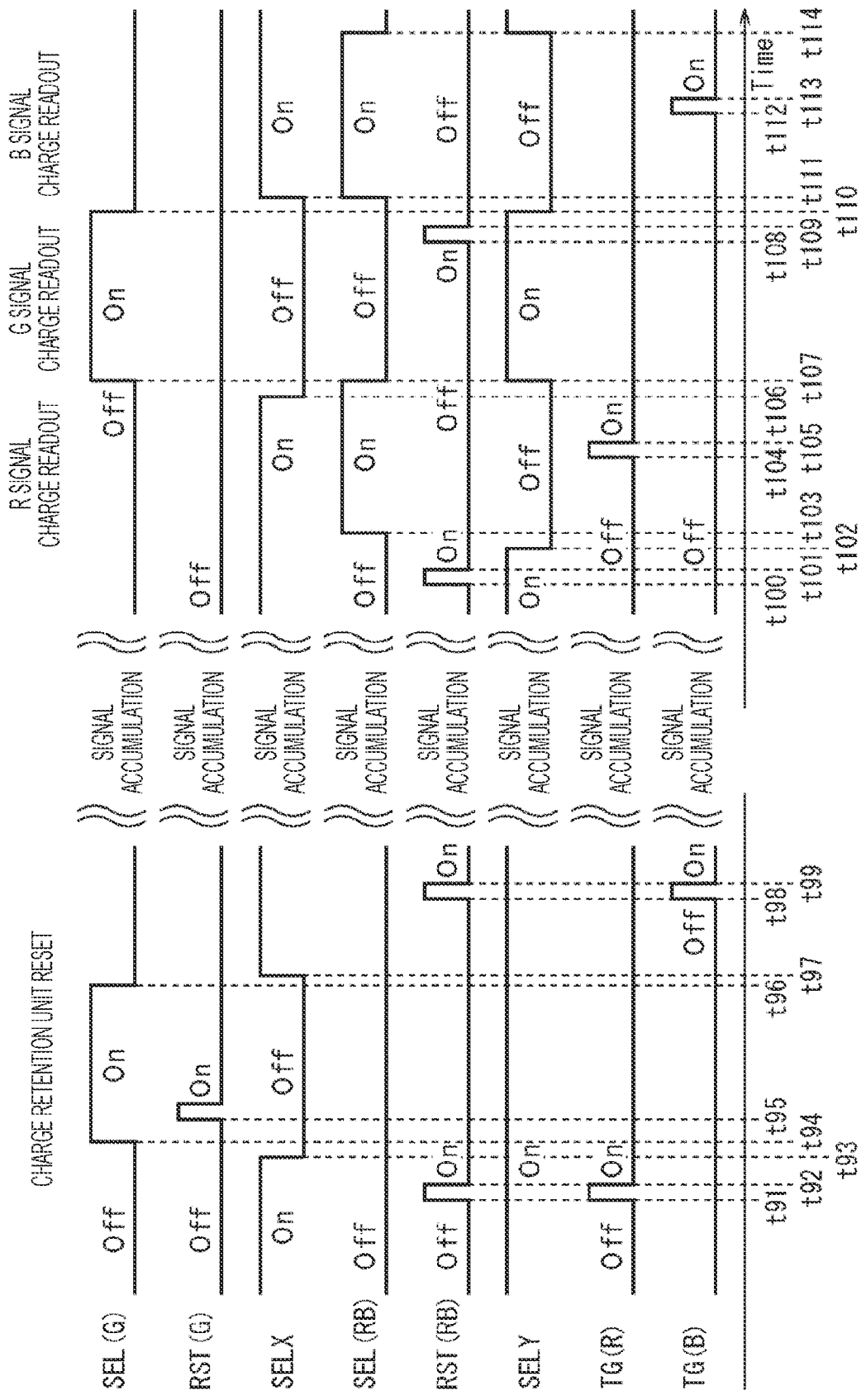
FIG. 34 is a diagram for explaining driving of the pixel according to the fifth embodiment.

Referring now to FIGS. 32 through 34, a fifth embodiment of a pixel to which the present technology is applied is described.

FIG. 32 shows an equivalent circuit of a pixel 51E according to the fifth embodiment.

The pixel 51E according to the fifth embodiment differs from the pixel 51D of the fourth embodiment in that a voltage control transistor 161RB is newly added to the pixel circuit 101RB for red light and blue light. The other aspects of the structure are the same as those of the pixel 51D shown in FIG. 29.

When switched on by a voltage control signal SELY supplied to its gate, the voltage control transistor 161RB sets (fixes) the source of the amplifier transistor 114RB at the power supply voltage VDD.

FIG. 33 shows a cross-section structure of the pixel 51E according to the fifth embodiment.

In FIG. 33, the pixel 51E differs from the pixel 51D of the fourth embodiment only in that a gate portion 161RBGT forming the voltage control transistor 161RB and an n-type diffusion layer 241 in the p-type semiconductor substrate 21 are newly added. The n-type diffusion layer 241 is equivalent to the drain of the voltage control transistor 161RB, and the power supply voltage VDD is applied to the n-type diffusion layer 241. The source of the voltage control transistor 161RB is formed with the n-type diffusion layer 233 that also functions as the source of the amplifier transistor 114RB.

<Fifth Driving>

Referring now to the timing chart in FIG. 34, driving (fifth driving) of the pixel 51E according to the fifth embodiment is described.

The fifth driving for green signal charge is the same as the above described second driving, and the fifth driving for red signal charge and blue signal charge is the same as the above described third driving. Signal charge reset operations and readout operations are performed for red signal charge, green signal charge, and blue signal charge in this order.

First, from time t91 to time t92, the reset transistor 113RB and the transfer transistor 191R are switched on, and the photodiode PD2 for red light is reset.

At time t93, the voltage control transistor 161G for green light is switched off. At time t94, the select transistor 151G is switched on. At time t95, the reset transistor 113G is switched on, and the voltage of the charge retention unit 112G is reset.

The select transistor 115G is switched off at time t96, and the voltage control transistor 161G is switched on at time t97.

From time t98 to time t99, the reset transistor 113RB and the transfer transistor 191B are switched on, and the photodiode PD1 for blue light is reset.

In the above manner, the operations to reset the red signal charge, the green signal charge, and the blue signal charge are completed. Signal charge accumulation is then started.

After completion of the signal charge accumulation, a red signal charge readout operation is performed.

The reset transistor 113RB is switched on at time t100, and after a certain period of time, is switched off at time t101. Consequently, the charge retention unit 112RB as an FD unit is reset, to read out the red signal charge.

The voltage control transistor 161RB is switched off at time t102, and the select transistor 115RB is switched on at time t103, so that the source as the output end of the amplifier transistor 114RB is connected to the column signal line 16.

Between time t104 and time 105, the transfer transistor 191R is switched on, and the red signal charge accumulated in the photodiode PD2 is transferred to the charge retention unit 112RB, and is output from the amplifier transistor 114RB to the column signal line 16.

After the accumulated red signal charge is read out, the voltage control transistor 161G is switched off at time t106. At time t107, the select transistor 115RB is switched off, and the select transistor 115G is switched on, so that the green signal charge accumulated in the charge retention unit 112G is output to a memory or the like in the AD converter via the column signal line 16. Note that, at time t107, the voltage control transistor 161RB is also switched on.

The reset transistor 113RB is switched on at time t108 during the green signal charge readout operation, and after a certain period of time, is switched off at time t109. Consequently, the charge retention unit 112RB as an FD unit is reset, to read out the blue signal charge.

At time t110, both the select transistor 115G and the voltage control transistor 161RB are switched off.

At time till, the select transistor 115RB and the voltage control transistor 161G are switched on. After that, between time t112 and t113, the transfer transistor 191B for blue light is switched on, and the blue signal charge accumulated in the photodiode PD1 is transferred to the charge retention unit 112RB, and is output from the amplifier transistor 114RB to the column signal line 16.

Lastly, at time t114, the select transistor 115RB for red light and blue light is switched off, and the voltage control transistor 161RB is switched on.

By the above fifth driving, green signal charge is read out while red signal charge and blue signal charge are being read out. Consequently, the operation to reset the red signal charge can be performed during the operation to read out the blue signal charge of the previous row, and the operation to reset the blue signal charge can be performed during the operation to read out the green signal charge. Thus, the speed of imaging of the solid-state imaging device can be increased.

Further, when the charge retention unit 112RB is reset, the potential of the output end and under the gate of the amplifier transistor 114RB is fixed by the voltage control transistor 161RB, so that the variation in the reset voltage at the time when the select transistor 115RB is switched on can be reduced. Thus, degradation of the imaging quality of the solid-state imaging device can be reduced.

In the pixel 51E of the fifth embodiment, the drain voltage of the voltage control transistors 161G and 161RB is set at the power supply voltage VDD, which is the same as the drain voltage of the amplifier transistor 114G in the pixel circuit 101G and the drain voltage of the reset transistor 113RB and the amplifier transistor 114RB in the pixel circuit 101RB. Thus, the types of power to be supplied to the pixel 51D can be reduced, and the pixel lines can be simplified.

Also, it is possible to prevent generation of a large current between the amplifier transistor 114G and the drain of the voltage control transistor 161G due to an increase in the voltage to be input to the amplifier transistor 114G at a time of reception of a large amount of light, as in the fourth embodiment.

Outline of an Example Structure of a Solid-State Imaging Device

Figure 35:
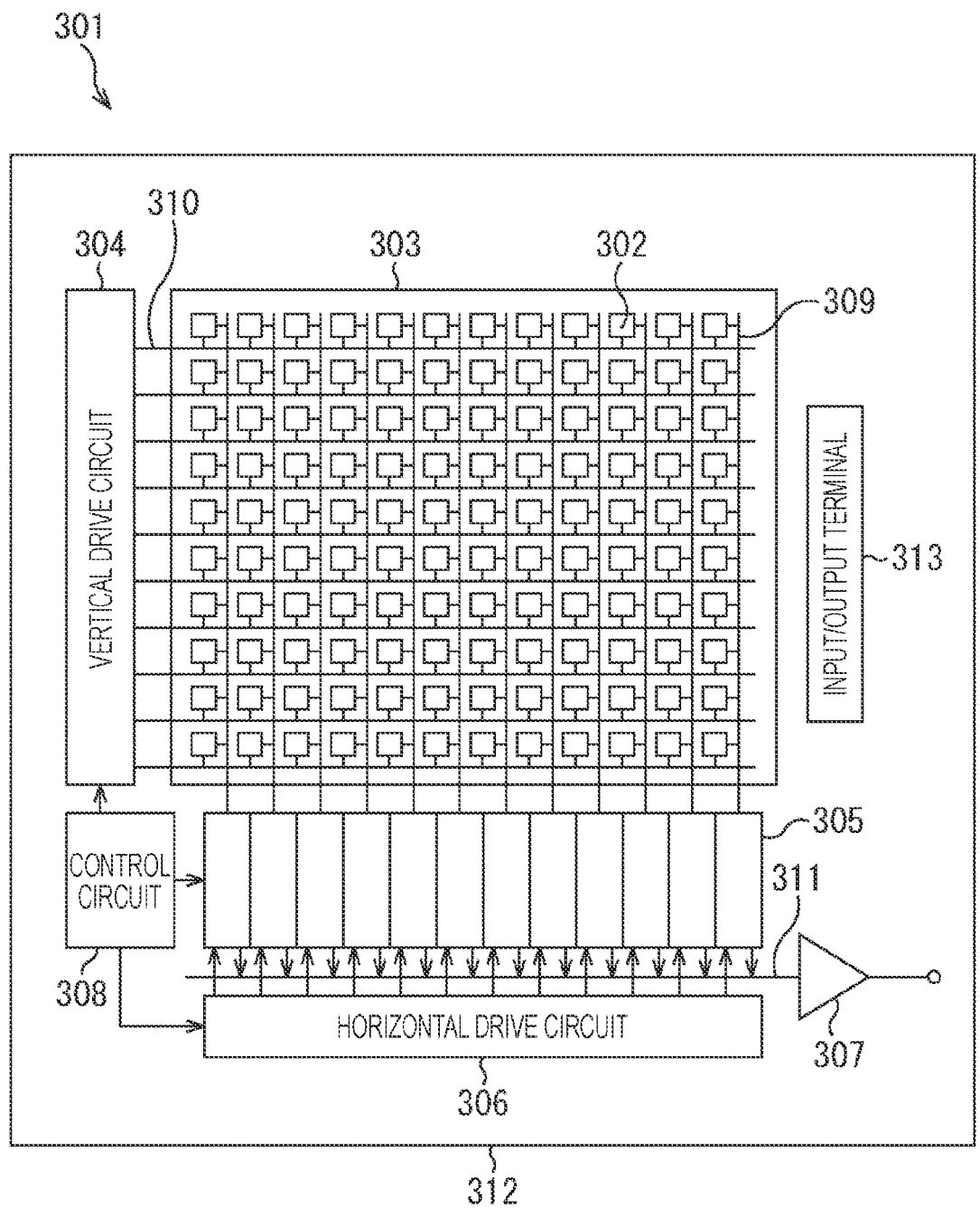
FIG. 35 is a diagram schematically showing the structure of a solid-state imaging device to which the present technology is applied.

The above described pixels 51A through 51E can be used as pixels of the solid-state imaging device shown in FIG. 35. That is, FIG. 35 is a diagram schematically showing the structure of a solid-state imaging device to which the present technology is applied.

The solid-state imaging device 301 shown in FIG. 35 includes a pixel array unit 303 having pixels 302 arranged in a two-dimensional array on a semiconductor substrate 312 using silicon (Si) as the semiconductor, for example, and a peripheral circuit unit existing around the pixel array unit 303. The peripheral circuit unit includes a vertical drive circuit 304, column signal processing circuits 305, a horizontal drive circuit 306, an output circuit 307, a control circuit 308, and the like.

One of the above described pixels 51A through 51E is used as a pixel 302.

The control circuit 308 receives an input clock and data that designates an operation mode and the like, and also outputs data such as internal information about the solid-state imaging device 301. That is, in accordance with a vertical synchronization signal, a horizontal synchronization signal, and a master clock, the control circuit 308 generates a clock signal and a control signal that serve as the references for operation of the vertical drive circuit 304, the column signal processing circuits 305, the horizontal drive circuit 306, and the like. The control circuit 308 then outputs the generated clock signal and control signal to the vertical drive circuit 304, the column signal processing circuits 305, the horizontal drive circuit 306, and the like.

The vertical drive circuit 304 is formed with a shift register, for example, selects a predetermined pixel drive line 310, supplies a pulse for driving the pixels 302 connected to the selected pixel drive line 310, and drives the pixels 302 on a row-by-row basis. That is, the vertical drive circuit 304 sequentially selects and scans the respective pixels 302 of the pixel array unit 303 on a row-by-row basis in the vertical direction, and supplies pixel signals in accordance with the signal charges generated in accordance with the amounts of light received in the photoelectric conversion units of the respective pixels 302, to the column signal processing circuits 305 through vertical signal lines 309.

The reset signals RST, RST(G), and RST(RB), the select signals SEL, SEL(B), and SEL(RB), the voltage control signals SELX and SELY, and the transfer signals TG, TG(R), and TG(B), which have been described above, are controlled by the vertical drive circuit 304 via the pixel drive lines 310.

The column signal processing circuits 305 are provided for the respective columns of the pixels 302, and perform signal processing such as denoising, on a column-by-column basis, on signals that are output from the pixels 302 of one row. For example, the column signal processing circuits 305 perform signal processing, such as CDS and AD conversion, to remove fixed pattern noise unique to pixels.

The horizontal drive circuit 306 is formed with a shift register, for example. The horizontal drive circuit 306 sequentially selects the respective column signal processing circuits 305 by sequentially outputting horizontal scan pulses, and causes the respective column signal processing circuits 305 to output pixel signals to a horizontal signal line 311.

The output circuit 307 performs signal processing on signals sequentially supplied from the respective column signal processing circuits 305 through the horizontal signal line 311, and outputs the processed signals. The output circuit 307 might perform only buffering, or might perform black level control, column variation correction, and various kinds of digital signal processing, for example. An input/output terminal 313 exchanges signals with the outside.

The solid-state imaging device 301 having the above structure is a so-called column AD type CMOS image sensor in which the column signal processing circuits 5 that perform a CDS process and an AD conversion process are provided for the respective pixel columns.

As one of the above described pixels 51A through 51E is used as a pixel 302 in the solid-state imaging device 301, the solid-state imaging device 301 can improve imaging quality by reducing the variation in the voltage of the charge retention unit (the charge retention unit 12, the charge retention unit 112G, or the charge retention unit 112RB) in the pixel 302.

Example Applications to Electronic Apparatuses

The present technology is not necessarily applied to a solid-state imaging device. Specifically, the present technology can be applied to any electronic apparatus using a solid-state imaging device as an image capturing unit (a photoelectric conversion unit), such as an imaging apparatus like a digital still camera or a video camera, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and has an imaging function.

Figure 36:
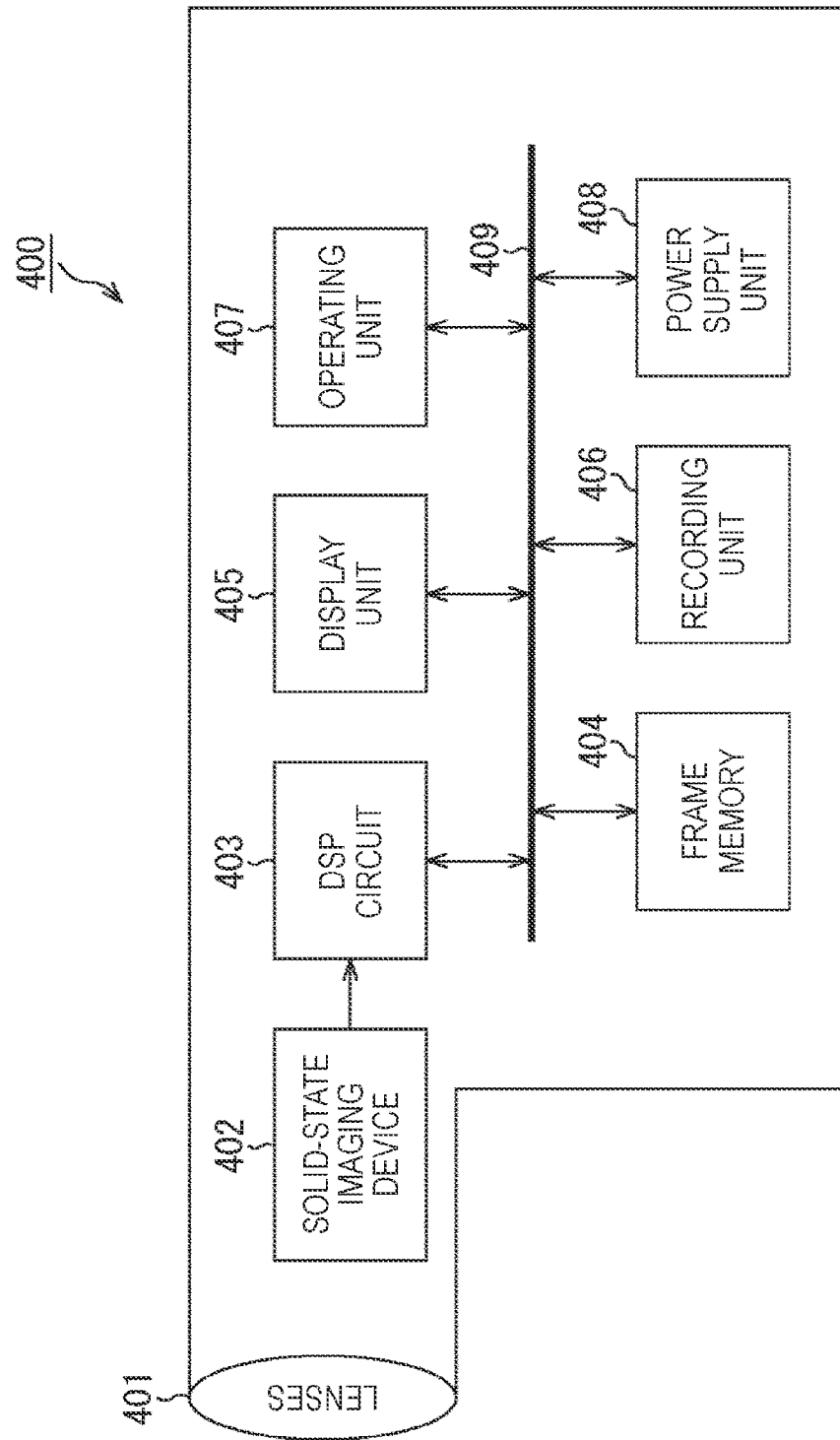
FIG. 36 is a block diagram showing an example structure of an imaging apparatus as an electronic apparatus to which the present technology is applied.

FIG. 36 is a block diagram showing an example structure of an imaging apparatus as an electronic apparatus to which the present technology is applied.

The imaging apparatus 400 shown in FIG. 36 includes an optical unit 401 formed with lenses and the like, a solid-state imaging device (an imaging device) 402 having the structure of the solid-state imaging device 301 shown in FIG. 35, and a digital signal processor (DSP) circuit 403 that is a camera signal processor circuit. The imaging apparatus 400 also includes a frame memory 404, a display unit 405, a recording unit 406, an operating unit 407, and a power supply unit 408. The DSP circuit 403, the frame memory 404, the display unit 405, the recording unit 406, the operating unit 407, and the power supply unit 408 are connected to one another via a bus line 409.

The optical unit 401 gathers incident light (image light) from an object and forms an image on the imaging surface of the solid-state imaging device 402. The solid-state imaging device 402 converts the amount of the incident light, which has been gathered as the image on the imaging surface by the optical unit 401, into an electrical signal for each pixel, and outputs the electrical signal as a pixel signal. The solid-state imaging device 301 shown in FIG. 35, or a solid-state imaging device that has increased imaging quality by reducing the variation in the voltage of the charge retention unit 12 or the like, can be used as the solid-state imaging device 402.

The display unit 405 is formed with a panel display device such as a liquid crystal panel or an organic electro-luminescence (EL) panel, and displays a moving image or a still image formed by the solid-state imaging device 402. The recording unit 406 records the moving image or the still image formed by the solid-state imaging device 402 into a recording medium such as a hard disk or a semiconductor memory.

When operated by a user, the operating unit 407 issues operating instructions as to various functions of the imaging apparatus 400. The power supply unit 408 supplies various power sources as the operation power sources for the DSP circuit 403, the frame memory 404, the display unit 405, the recording unit 406, and the operating unit 407, as appropriate.

As the solid-state imaging device 301 including the pixels 51A through 51E according to the above described respective embodiments is used as the solid-state imaging device 402 as described above, the imaging quality of the solid-state imaging device 402 can be increased.

Accordingly, the quality of captured images can also be increased in the imaging apparatus 400, which is a video camera, a digital still camera, a cameral module for mobile devices such as portable telephone devices, or the like.

Note that, in a case where the photoelectric conversion unit 11 is the photodiode PD formed by a PN junction in an example described above, the first conductivity type is the p-type, the second conductivity type is the n-type, and electrons are used as the signal charge. However, the first conductivity type may be the n-type, the second conductivity type may be the p-type, and holes may be used as the signal charge. Also, a pixel transistor may be formed with an n-type MOS, instead of a p-type MOS.

Also, the present technology can be applied not only to solid-state imaging devices that sense an incident light quantity distribution of visible light and form an image in accordance with the distribution, but also to solid-state imaging devices (physical quantity distribution sensors) in general, such as a solid-state imaging device that senses an incident quantity distribution of infrared rays, X-rays, particles, or the like, and forms an image in accordance with the distribution, or a fingerprint sensor that senses a distribution of some other physical quantity in a broad sense, such as pressure or capacitance, and forms an image in accordance with the distribution.

It should be noted that embodiments of the present technology are not limited to the above described embodiments, and various modifications may be made to the above embodiments without departing from the scope of the present disclosure.

For example, it is possible to employ a combination of all or some of the above described embodiments.

Note that, the advantageous effects described in this specification are merely examples, and the advantageous effects of the present technology are not limited to them and may include effects other than those described in this specification.

Note that, the present disclosure may also be embodied in the structures described below.

(1)
A solid-state imaging device including
a pixel that includes:
a first photoelectric conversion unit that generates and accumulates signal charge by receiving light having entered the pixel and photoelectrically converting the light;
a first charge retention unit that retains the signal charge generated by the first photoelectric conversion unit;
a first select transistor that controls selecting of the pixel;
a first output transistor that outputs the signal charge in the first charge retention unit as a pixel signal when the pixel is selected by the first select transistor; and
a first voltage control transistor that controls the voltage of the output end of the first output transistor.

(2)
The solid-state imaging device of (1), wherein:
the first photoelectric conversion unit photoelectrically converts light of a first wavelength; and
the pixel further includes:
a second photoelectric conversion unit that generates signal charge by receiving light of a second wavelength and photoelectrically converting the light, the second wavelength being different from the first wavelength;
a third photoelectric conversion unit that generates signal charge by receiving light of a third wavelength and photoelectrically converting the light, the third wavelength being different from the first wavelength and the second wavelength;

a second charge retention unit that retains the signal charge generated by the second and third photoelectric conversion units;
a second select transistor that controls selecting of the pixel; and
a second output transistor that outputs the signal charge in the second charge retention unit as a pixel signal when the pixel is selected by the second select transistor.

(3)
The solid-state imaging device of (1) or (2), wherein the pixel further includes
a second voltage control transistor that controls the voltage of the output end of the second output transistor.

(4)
The solid-state imaging device of any of (1) through (3), wherein the first photoelectric conversion unit is formed with a structure having a photoelectric conversion film interposed between upper and lower electrodes.

(5)
The solid-state imaging device of any of (1) through (4), wherein the first photoelectric conversion unit is formed with a photodiode formed by a PN junction in a semiconductor substrate.

(6)
The solid-state imaging device of any of (1) through (5), wherein the signal charge generated by the first photoelectric conversion unit is holes.

(7)
The solid-state imaging device of any of (1) through (6), wherein the signal charge generated by the first photoelectric conversion unit is electrons.

(8)
The solid-state imaging device of any of (1) through (7), wherein:
the first charge retention unit includes a diffusion layer of a second conductivity type, the diffusion layer being formed in a semiconductor substrate of a first conductivity type; and
the reset voltage for resetting the voltage of the first charge retention unit is a voltage equal to the potential of the first conductivity type.

(9)
The solid-state imaging device of (8), wherein the first conductivity type is the p-type, and the second conductivity type is the n-type.

(10)
The solid-state imaging device of any of (1) and (5) through (9), further including
a transfer transistor that transfers the signal charge generated by the first photoelectric conversion unit to the first charge retention unit.

(11)
The solid-state imaging device of any of (1) and (5) through (10), wherein the first charge retention unit is a floating diffusion unit.

(12)
The solid-state imaging device of any of (1) through (11), wherein the drain voltage of the first voltage control transistor is equal to the drain voltage of the output transistor.

(13)
The solid-state imaging device of any of (1) through (12), wherein the first voltage control transistor is a deep-depletion transistor.

(14)
The solid-state imaging device of any of (1) through (13), wherein a negative bias is used as the off-state voltage of the first voltage control transistor.

(15)

The solid-state imaging device of any of (1) through (14), wherein the first voltage control transistor is controlled to be invariably in an off-state while the first select transistor is in an on-state.

(16)

The solid-state imaging device of any of (1) through (15), wherein the first voltage control transistor is switched off before the first select transistor is switched on.

(17)

The solid-state imaging device of any of (1) through (16), wherein, after an operation to reset the first charge retention unit is performed while the first select transistor is in an on-state and the first voltage control transistor is in an off-state, signal accumulation is performed by the first photoelectric conversion unit while the first select transistor is in an off-state and the first voltage control transistor is in an on-state.

(18)

The solid-state imaging device of any of (1) through (16), wherein, after an operation to reset the first charge retention unit is performed while the first select transistor is in an off-state and the first voltage control transistor is in an on-state, the signal at the time of the reset is read out while the first select transistor is in an on-state and the first voltage control transistor is in an off-state.

(19)

A method of driving a solid-state imaging device including a pixel that includes a first photoelectric conversion unit, a first charge retention unit, a first select transistor, a first output transistor, and a first voltage control transistor, the method including:
the first photoelectric conversion unit generating and accumulating signal charge by receiving light having entered the pixel and photoelectrically converting the light;
the first charge retention unit retaining the signal charge generated by the first photoelectric conversion unit;
the first select transistor controlling selecting of the pixel;
the first output transistor outputting the signal charge in the first charge retention unit as a pixel signal when the pixel is selected by the first select transistor; and
the first voltage control transistor controlling the voltage of the output end of the first output transistor.

(20)

An electronic apparatus including
a solid-state imaging device including
a pixel that includes:
a first photoelectric conversion unit that generates and accumulates signal charge by receiving light having entered the pixel and photoelectrically converting the light;
a first charge retention unit that retains the signal charge generated by the first photoelectric conversion unit;
a first select transistor that controls selecting of the pixel;
a first output transistor that outputs the signal charge in the first charge retention unit as a pixel signal when the pixel is selected by the first select transistor; and
a first voltage control transistor that controls the voltage of the output end of the first output transistor.

REFERENCE SIGNS LIST

11 Photoelectric conversion unit
12 Charge retention unit
13 Reset transistor
14 Amplifier transistor
15 Select transistor
16 Column signal line
21 P-type semiconductor substrate
22 N-type diffusion layer
28 Photoelectric conversion film
29A Upper electrode
29B Lower electrode
51A-51E Pixel
61 Voltage control transistor
91 Transfer transistor
111R, 111B Photoelectric conversion unit
112RB Charge retention unit
113RB Reset transistor
114RB Amplifier transistor
115RB Select transistor
161RB Voltage control transistor
191B, 191G Transfer transistor
301 Solid-state imaging device
302 Pixel
400 Imaging apparatus
402 Solid-state imaging device

The invention claimed is:

1. A light detecting device, comprising:
a first photoelectric conversion element;
a first floating diffusion electrically coupled to the first photoelectric conversion element;
a first transistor, a gate of the first transistor being electrically coupled to the first floating diffusion;
a second transistor, one of a source and a drain of the second transistor being electrically coupled to one of a source and a drain of the first transistor; and
a third transistor, one of a source and a drain of the third transistor being electrically coupled to the one of the source and the drain of the first transistor and the one of the source and the drain of the second transistor, wherein a gate of the third transistor is coupled to a drive circuit, and wherein the drive circuit is a vertical drive circuit.

2. The light detecting device according to claim 1, wherein the other of the source and the drain of the third transistor is electrically coupled to a constant voltage.

3. The light detecting device according to claim 1, wherein the first transistor outputs signal charge in the first floating diffusion as a pixel signal.

4. The light detecting device according to claim 1, wherein the second transistor controls selecting of a pixel that includes the first photoelectric conversion element.

5. The light detecting device according to claim 1, wherein the third transistor controls a voltage of the one of the source and the drain of the first transistor.

6. The light detecting device according to claim 1, wherein a voltage of the other of the source or the drain of the first transistor is equal to a voltage of the other of the source or the drain of the third transistor.

7. The light detecting device according to claim 6, wherein the other of the source or the drain of the first transistor is electrically coupled to a power supply voltage.

8. The light detecting device according to claim 1, wherein:
the first photoelectric conversion element belongs to a pixel and photoelectrically converts light of a first wavelength; and
the pixel further comprises:
a second photoelectric conversion element which photoelectrically converts light of a second wavelength different from the first wavelength;

a second floating diffusion electrically coupled to the second photoelectric conversion element;

a fourth transistor, a gate of the fourth transistor being electrically coupled to the second floating diffusion; and a fifth transistor, one of a source or a drain of the fifth transistor being electrically coupled to one of a source or a drain of the fourth transistor.

9. The light detecting device according to claim 8, wherein the pixel further comprises a third photoelectric conversion element which is electrically coupled to the second floating diffusion and photoelectrically converts light of a third wavelength different from the first wavelength and the second wavelength.

10. The light detecting device according to claim 8, wherein the pixel further comprises a sixth transistor, one of a source or a drain of the sixth transistor being electrically coupled to the one of the source or the drain of the fourth transistor and being electrically coupled to the one of the source or the drain of the fifth transistor.

11. The light detecting device according to claim 1, wherein the first photoelectric conversion element is formed with a structure having a photoelectric conversion film interposed between upper and lower electrodes.

12. The light detecting device according to claim 1, wherein the first photoelectric conversion element is formed by a PN junction in a semiconductor substrate.

13. The light detecting device according to claim 3, wherein the signal charge generated by the first photoelectric conversion element comprises holes.

14. The light detecting device according to claim 3, wherein the signal charge generated by the first photoelectric conversion element comprises electrons.

15. The light detecting device according to claim 1, wherein:

the first floating diffusion comprises a diffusion layer of a first conductivity type, the diffusion layer being formed in a semiconductor substrate of a second conductivity type.

16. The light detecting device according to claim 15, wherein the first conductivity type is n-type, and wherein the second conductivity type is p-type.

17. The light detecting device according to claim 1, further comprising a fourth transistor, one of a source or a drain of the fourth transistor being electrically coupled to the first photoelectric conversion element and the other of the source or the drain of the fourth transistor being electrically coupled to the first floating diffusion.

18. An electronic apparatus comprising:
a drive circuit; and
a light detecting device, comprising:
a first photoelectric conversion element;
a first floating diffusion electrically coupled to the first photoelectric conversion element;
a first transistor, a gate of the first transistor being electrically coupled to the first floating diffusion;
a second transistor, one of a source and a drain of the second transistor being electrically coupled to one of a source and a drain of the first transistor; and
a third transistor, one of a source and a drain of the third transistor being electrically coupled to the one of the source and the drain of the first transistor and the one of the source and the drain of the second transistor, wherein a gate of the third transistor is coupled to the drive circuit, and wherein the drive circuit is a vertical drive circuit.

19. The electronic apparatus according to claim 18, wherein the other of the source and the drain of the third transistor is electrically coupled to a constant voltage.

* * * * *